(12) United States Patent
Core et al.

(10) Patent No.: US 11,438,706 B2
(45) Date of Patent: Sep. 6, 2022

(54) ROBUST MEMS MICROPHONE

(71) Applicant: Vesper Technologies, Inc., Boston, MA (US)

(72) Inventors: Craig Core, North Andover, MA (US); Hamid Basaeri, Cambridge, MA (US); Robert Littrell, Belmont, MA (US)

(73) Assignee: Vesper Technologies Inc., Boston, MA (US)

( * ) Notice: Subject to any disclaimer, the term of this patent is extended or adjusted under 35 U.S.C. 154(b) by 0 days.

(21) Appl. No.: 17/143,934

(22) Filed: Jan. 7, 2021

(65) Prior Publication Data

US 2021/0211809 A1 Jul. 8, 2021

Related U.S. Application Data

(60) Provisional application No. 62/958,050, filed on Jan. 7, 2020.

(51) Int. Cl.
*H04R 19/00* (2006.01)
*H04R 19/04* (2006.01)
*B81B 3/00* (2006.01)
*B81C 1/00* (2006.01)
*H04R 31/00* (2006.01)
(Continued)

(52) U.S. Cl.
CPC ........... *H04R 19/04* (2013.01); *B81B 3/0021* (2013.01); *B81C 1/00158* (2013.01); *H04R 1/04* (2013.01); *H04R 7/06* (2013.01); *H04R 19/005* (2013.01); *H04R 31/003* (2013.01); *B81B 2201/0257* (2013.01); *B81B 2203/019* (2013.01); *B81B 2203/0127* (2013.01); *B81B 2203/0315* (2013.01); *B81B 2207/012* (2013.01); *B81C 2201/013* (2013.01); *H04R 2201/003* (2013.01)

(58) Field of Classification Search
CPC . H04R 19/04; H04R 1/04; H04R 7/06; H04R 19/005; H04R 31/003; H04R 2201/003; H04R 31/00; H04R 17/02; B81B 3/0021; B81B 2201/0257; B81B 2203/0127; B81B 2203/019; B81B 2203/0315; B81B 2207/012; B81B 2203/0361; B81B 7/0016; B81C 1/00158; B81C 2201/013
See application file for complete search history.

(56) References Cited

U.S. PATENT DOCUMENTS 8,921,957 B1 * 12/2014 Zhang ................. H04R 19/005
381/174
2017/0150248 A1 5/2017 Littrell
(Continued)

OTHER PUBLICATIONS

International Search Report and Written Opinion of the International Searching Authority for Application No. PCT/US2021/012526, dated Apr. 1, 2021 (15 pages).

*Primary Examiner* — Matthew A Eason
(74) *Attorney, Agent, or Firm* — Nutter McClennen & Fish LLP

(57) ABSTRACT

A robust MEMS transducer includes a kinetic energy diverter disposed within its frontside cavity. The kinetic energy diverter blunts or diverts kinetic energy in a mass of air moving through the frontside cavity, before that kinetic energy reaches a diaphragm of the MEMS transducer. The kinetic energy diverter renders the MEMS transducer more robust and resistant to damage from such a moving mass of air.

27 Claims, 16 Drawing Sheets

(51) Int. Cl.
*H04R 1/04* (2006.01)
*H04R 7/06* (2006.01)

(56) References Cited

U.S. PATENT DOCUMENTS

| | | |
|---|---|---|
| 2017/0230757 A1 | 8/2017 | Kuntzman et al. |
| 2018/0376254 A1* | 12/2018 | Pal ........................ B81B 7/0064 |
| 2019/0098417 A1 | 3/2019 | Littrell et al. |
| 2019/0281393 A1 | 9/2019 | Grosh et al. |
| 2019/0289405 A1 | 9/2019 | Littrell et al. |
| 2020/0092658 A1* | 3/2020 | Zou ...................... H04R 19/005 |

* cited by examiner

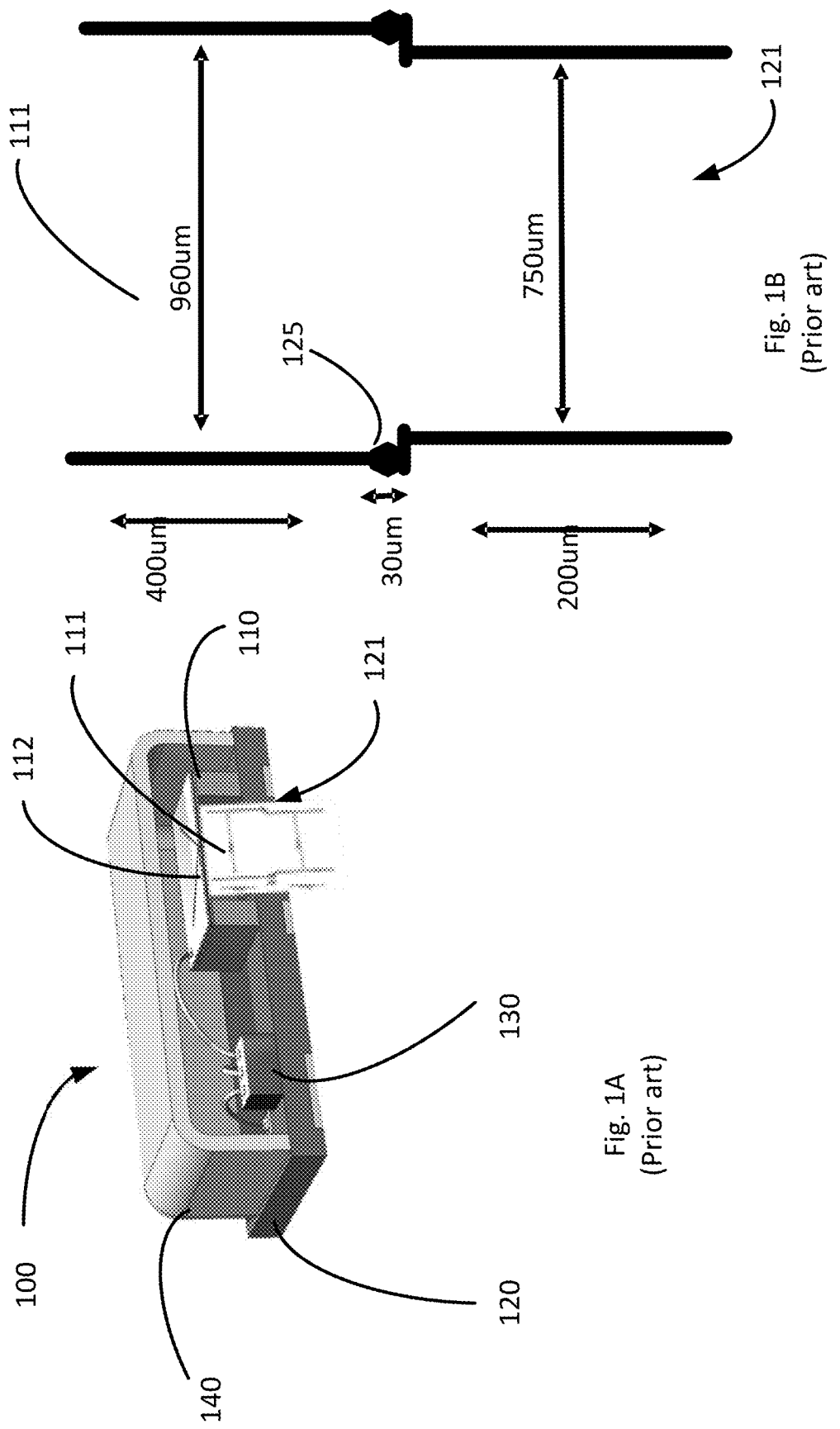

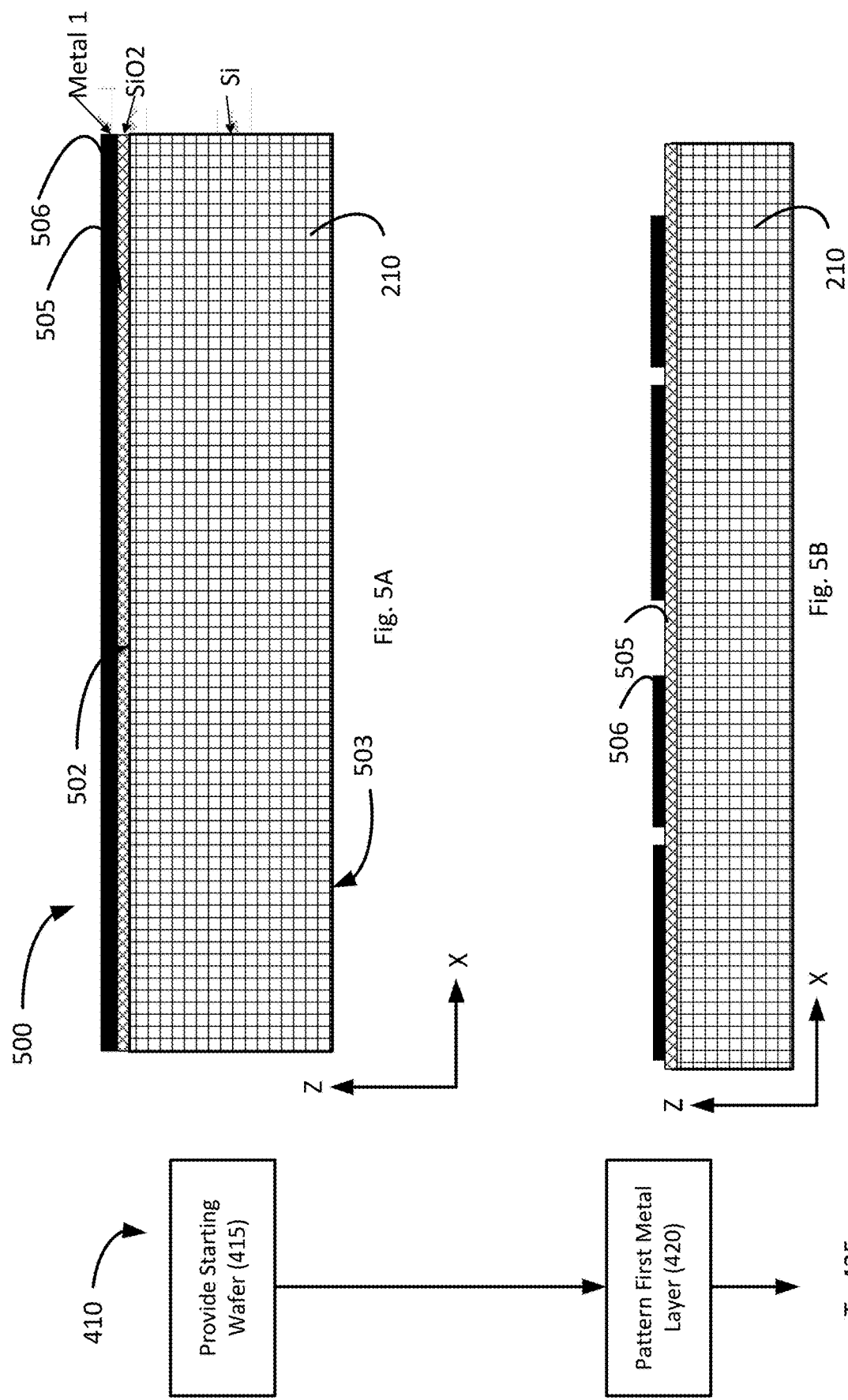

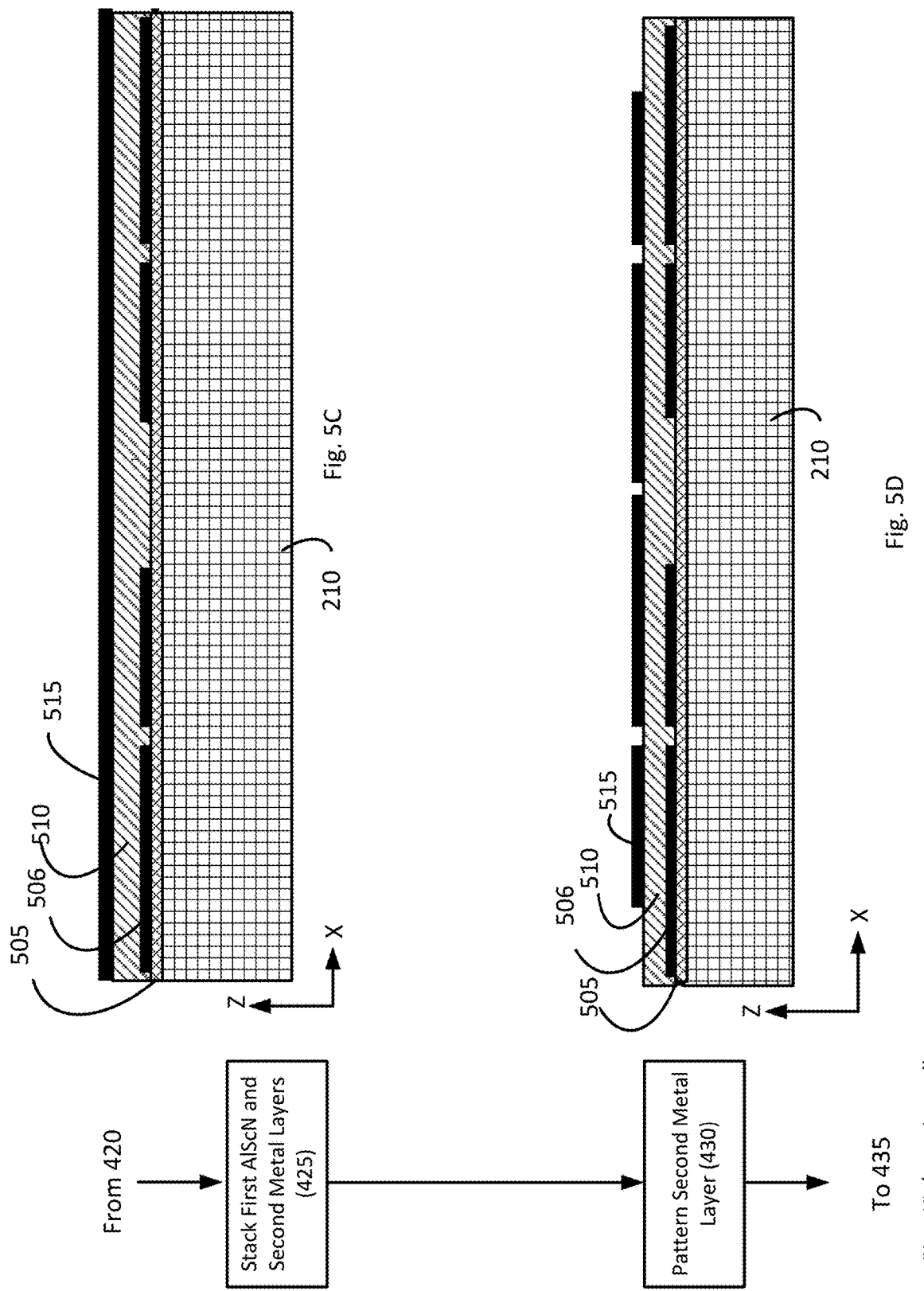

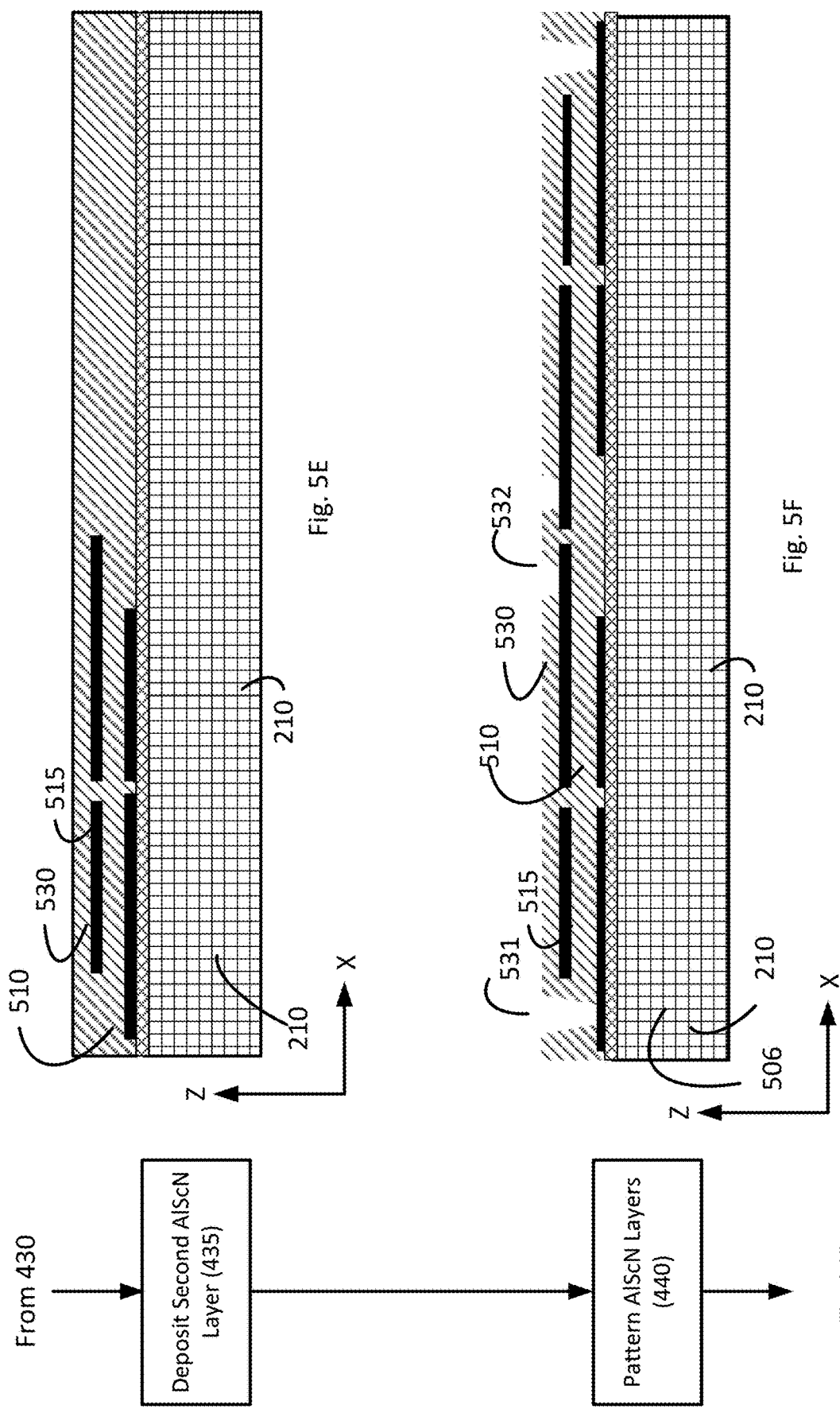

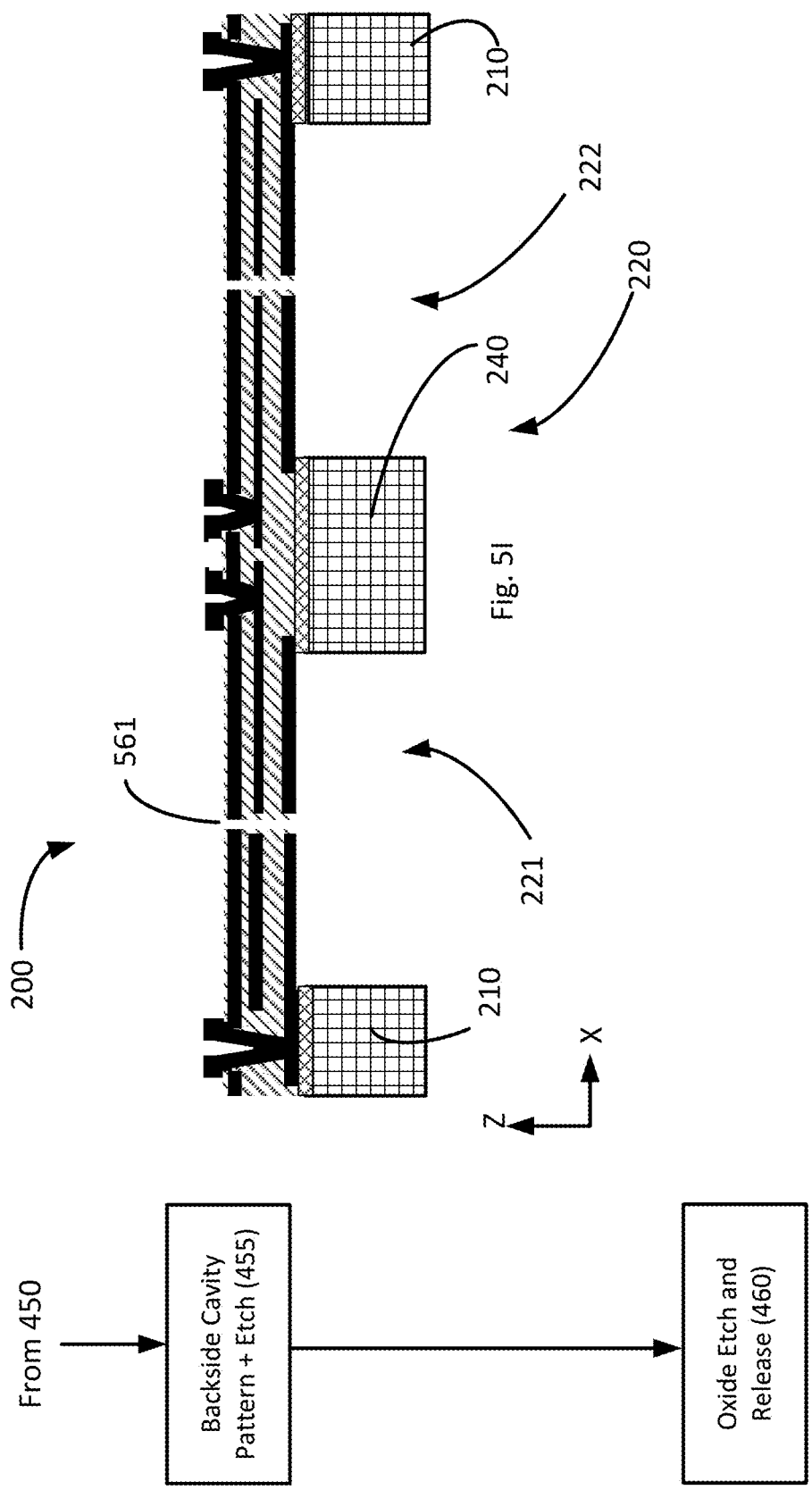

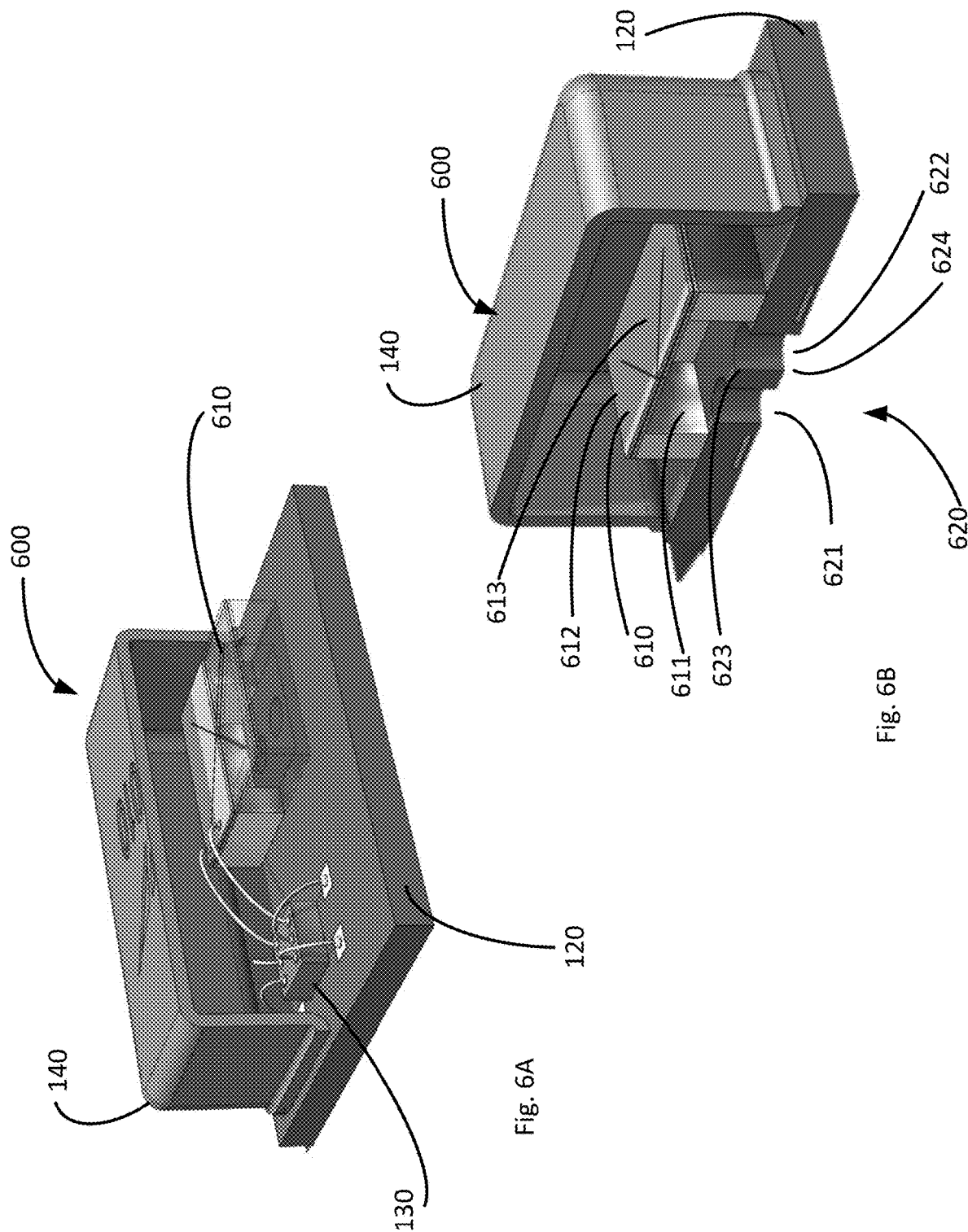

ROBUST MEMS MICROPHONE

RELATED APPLICATIONS

This application claims priority to U.S. Provisional Application No. 62/958,050, filed Jan. 7, 2020 and titled "Robust MEMS Microphone" and naming Craig Core, Hamid Basaeri, and Robert Littrell as inventors.

The disclosure of the foregoing application is incorporated herein, in its entirety, by reference.

TECHNICAL FIELD

The present disclosure relates to acoustic sensors and, more particularly, to improving the reliability of acoustic sensors.

BACKGROUND

A micro-electro-mechanical system (MEMS) acoustic transducer/sensor coverts acoustic energy into electrical signal, and/or converts an electrical signal into acoustic energy. An example of a MEMS acoustic transducer is a MEMS microphone, which converts sound pressure into an electrical voltage. Based on their transduction mechanisms, MEMS microphones can be made in various forms, such as capacitive microphones or piezoelectric microphones.

MEMS capacitive microphones and electret condenser microphones (ECMs) currently dominate the consumer electronics. Piezoelectric MEMS microphones, however, occupy a growing portion of the consumer market, and have unique advantages compared to their capacitive counterparts. Among other things, piezoelectric MEMS microphones do not require a back plate, eliminating the squeeze film damping, which is an intrinsic noise source for capacitive MEMS microphones. In addition, piezoelectric MEMS microphones are reflow-compatible and can be mounted to a printed circuit board (PCB) using typical lead-free solder processing, which could irreparably damage typical ECMs.

A MEMS transducer, such as a microphone, may be damaged by a mass of high velocity air impacting the microphone's diaphragm. For example, some mobile phones include a MEMS microphone disposed at an opening in the phone's surface. If the mobile phone falls and lands such that the opening hits a flat surface, a mass of air may be forced into the opening and impact the diaphragm. In response, the diaphragm may move beyond its physical limits and deform or break, or may impact another structure, such as a the backplate in a capacitive microphone.

Conventional capacitive microphones have a flexible diaphragm next to backplate. Depending on the location of the diaphragm and backplate, an oncoming mass of air may reach the diaphragm first and push the diaphragm into the backplate, potentially damaging the diaphragm and/or causing the diaphragm to stick to the backplate. Alternately, if the mass of air reaches the backplate first, it may pass through the backplate and push the diaphragm away from the backplate, potentially damaging the diaphragm.

Some mobile phone manufacturers require MEMS microphones to withstand a fall from a specified height, such as one meter, onto flat surface without detrimental effect on the MEMS microphone.

Manufacturers of MEMS microphones have taken a variety of approaches to make their microphones more robust. Some manufacturers have made their diaphragms and their suspension components thicker and/or stiffer, but such diaphragms are less flexible and their response to impinging acoustic energy is undesirably limited relative to more flexible diaphragms.

SUMMARY OF VARIOUS EMBODIMENTS

In accordance with an illustrative embodiment, a transducer system includes a semiconductor substrate having a top layer, and a bottom surface opposite the top layer; a frontside cavity extending into the substrate from the bottom surface and forming an aperture at the bottom surface; a transducer element having a movable diaphragm disposed at the top layer of the substrate and exposed to the aperture through the frontside cavity; and a rigid kinetic energy diverter configured to divert kinetic energy of a mass of air moving toward the movable diaphragm, the rigid kinetic energy diverter disposed within the frontside cavity and extending into the frontside cavity in a direction away from the movable diaphragm, the kinetic energy diverter having an end exposed to the aperture and distal from the diaphragm, such that the exposed distal end is nearer to the bottom surface than it is to the diaphragm.

In some embodiments, the movable diaphragm includes a first diaphragm and a second diaphragm, the first diaphragm and a second diaphragm each configured to produce an electrical output (e.g., a first electrical output and a second electrical output, respectively) in response to incident acoustic energy, and wherein: the first diaphragm and the second diaphragm are separated by a bridge; the rigid kinetic energy diverter is suspended from the bridge; and the first diaphragm is electrically coupled to the second diaphragm to sum the individual outputs so that the first diaphragm and the second diaphragm form a single capacitor.

In some embodiments, the movable diaphragm has a geometric center, and the rigid kinetic energy diverter is disposed in line with the geometric center of the movable diaphragm.

In some embodiments, the exposed end of the rigid kinetic energy diverter is concave.

In some embodiments, the distance between the top layer and the bottom surface defines a thickness of the substrate, and wherein the rigid kinetic energy diverter extends from the top layer into the frontside cavity a distance of at least one half of the substrate thickness.

In some embodiments, the rigid kinetic energy diverter extends through the frontside cavity so that the exposed end extends to a plane defined by the bottom surface.

In some embodiments, the rigid kinetic energy diverter is contiguous with the top layer.

In some embodiments, the frontside cavity has a plurality of portions separated by the rigid kinetic energy diverter, each portion of the plurality of portions exposing an underside of the transducer structure through the frontside cavity.

In some embodiments, the frontside cavity defines a set of sidewalls, and wherein the rigid kinetic energy diverter is suspended from the set of sidewalls.

Some embodiments further include a backplate forming a variable capacitor with the movable diaphragm, the backplate disposed between the frontside cavity and the movable diaphragm, and wherein the rigid kinetic energy diverter is suspended from the backplate.

Another embodiment is a method of fabricating a robust MEMS transducer, the method including providing a starting substrate having a top surface and a bottom surface; fabricating a transducer structure in or on the top surface; and fabricating a frontside cavity, the frontside cavity forming an aperture in the bottom surface of the starting substrate and extending inward from the bottom surface towards and to the transducer structure, the frontside cavity including an diverter structure suspended within the frontside cavity, the diverter structure having a bottom face, the bottom face being closer to the bottom surface of the substrate than to the transducer structure.

In some embodiments of the method, the substrate is or includes a silicon substrate, and fabricating the frontside cavity includes etching the frontside cavity into the bottom surface of the silicon substrate, the frontside cavity exposing an underside of the transducer structure, said etching leaving a portion of the substrate to form the diverter structure.

In some embodiments, the frontside cavity has a plurality of portions separated by the diverter structure, each portion of the plurality of portions exposing the underside of the transducer structure.

In some embodiments, a distance between the top surface and the bottom surface defines a thickness of the substrate, and wherein the rigid kinetic energy diverter extends from the top layer into the frontside cavity a distance of at least one half of the substrate thickness.

In some embodiments, a distance between the top surface and the bottom surface defines a thickness of the substrate, and wherein the rigid kinetic energy diverter extends from the top layer into the frontside cavity a distance of at least three-quarters of the substrate thickness.

Another illustrative embodiment includes a transducer having a transducer element and a frontside cavity, the transducer element having a movable diaphragm exposed to the frontside cavity; a transducer system substrate, the system substrate having: an acoustic aperture system including a plurality of aperture portions; and a rigid septum defined by the plurality of aperture portions, and spanning the acoustic aperture system, the rigid septum having an exposed face distal from the moveable diaphragm, the rigid septum configured to divert kinetic energy of a mass of air moving toward the diaphragm; the transducer affixed on the substrate with the frontside cavity covering the acoustic aperture system, such that an acoustic signal may pass through each of the plurality of aperture portions and reach the moveable diaphragm.

In some embodiments, the transducer includes a MEMS transducer, the MEMS transducer further having: a rigid kinetic energy diverter configured to divert the kinetic energy of the mass of air moving toward the movable diaphragm, the rigid kinetic energy diverter disposed within the frontside cavity and extending into the frontside cavity in a direction away from the movable diaphragm, the kinetic energy diverter having an exposed end distal from the diaphragm, such that the exposed distal end is nearer to the septum than it is to the diaphragm.

In some embodiments, wherein the transducer is affixed to a top surface of the system substrate by a die attach, the die attach having a die attach thickness, the system further includes a gap between the exposed end of the energy diverter and the septum, which gap has a thickness equal to the die attach thickness.

In some embodiments, the system substrate has a top surface, and the energy diverter is aligned with the septum such that a straight line normal to the to surface of the system substrate would pass through both the energy diverter and the septum.

In some embodiments, the transducer system further includes a cover secured to the system substrate, the cover and the system substrate defining a package volume, wherein the transducer is affixed to the system substrate within the package volume, along with an ASIC coupled to the transducer to receive an electrical output produced by the transducer in response to an acoustic signal entering the system through the acoustic aperture system.

BRIEF DESCRIPTION OF THE DRAWINGS

The features of embodiments will be more readily understood by reference to the following detailed description, taken with reference to the accompanying drawings, in which:

FIG. 1A and FIG. 1B schematically illustrate a cross-section of a prior art microphone system;

FIG. 5A, FIG. 5B, FIG. 5C, FIG. 5D, FIG. 5E, FIG. 5F, FIG. 5G, FIG. 5H, and FIG. 5I each schematically illustrates a cross-section of an embodiment of a robust MEMS transducer at various stages of fabrication;

FIG. 6A. FIG. 6B and FIG. 6C schematically illustrate cross-sections of alternate embodiments of a transducer system.

DETAILED DESCRIPTION OF SPECIFIC EMBODIMENTS

Figure 2A:
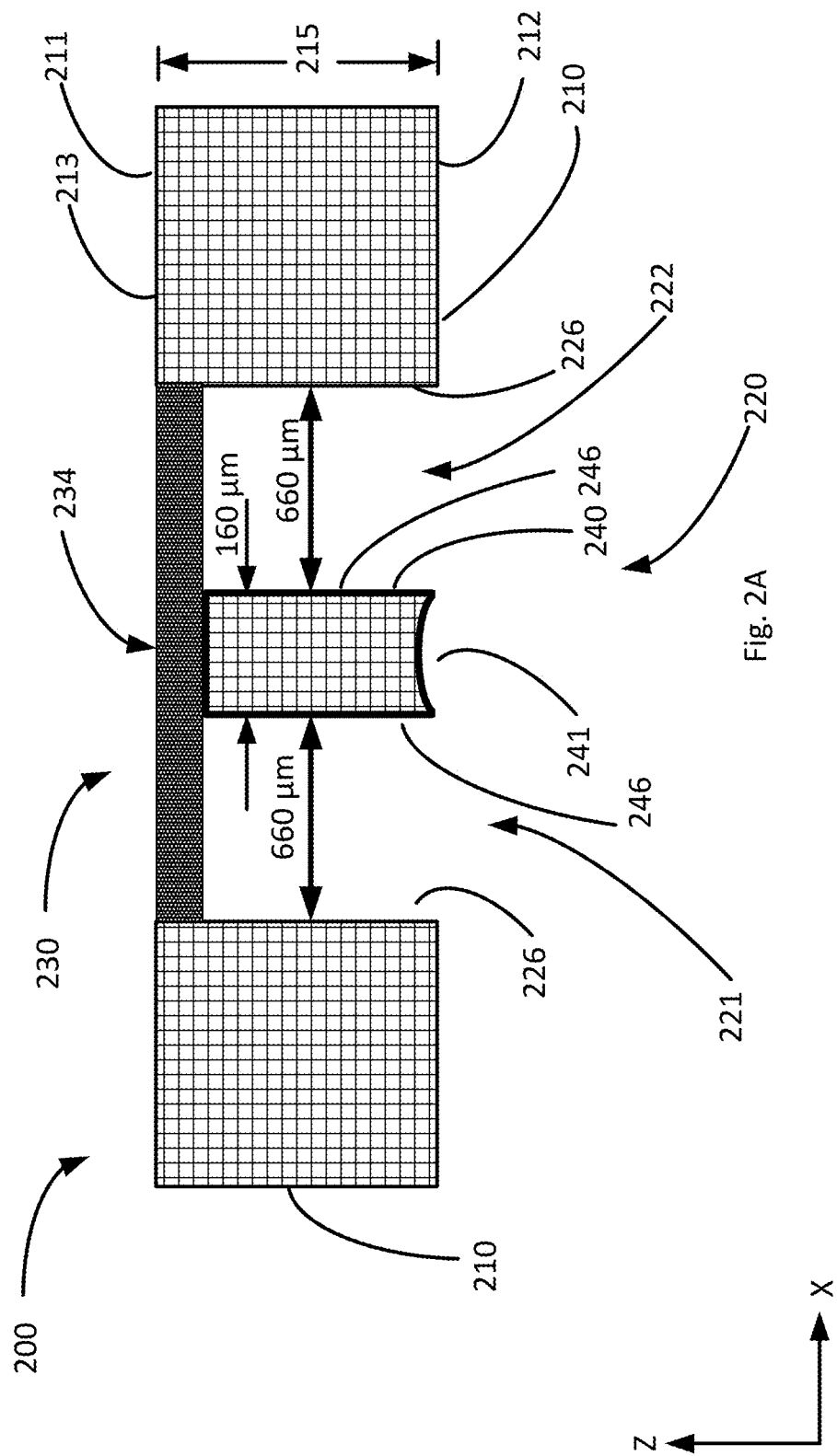
FIG. 2A schematically illustrates a cross-section of an embodiment of a robust MEMS transducer.

Various embodiments disclose a MEMS transducer with enhanced resistance to damage from an incident mass of moving air, such as might occur for example when the transducer, or a device that incorporates the transducer, is dropped.

Definitions

An "ASIC" is an application-specific integrated circuit.

A "set" includes at least one member. For example, a set of transducer elements may include as few as a single transducer element, or a plurality of two or more transducer elements.

The term "acoustic signal" means energy propagating through a fluid medium via a mechanical wave. An acoustic signal may propagate through a stationary fluid medium in that the fluid medium may experience zero net displacement due to the propagation of acoustic energy through the medium. A mass of fluid (e.g., a mass of air) shall not be considered to be a moving mass of fluid merely because an acoustic signal is propagating through it.

A "transducer" is an apparatus that converts variations in a physical quantity, such as acoustic signals or pressure, into an electrical signal, or that converts an electrical signal into variations in a physical quantity. Examples of transducers include, without limitation, microphones, pressure sensors, and speakers. Some embodiments herein are described and illustrated with a microphone transducer, but embodiments are not limited to microphones, and claims are not limited to microphones unless expressly limited to microphones.

The term "diaphragm" refers to a portion of a transducer that moves in response to an impinging physical signal (e.g., an acoustic signal) to create, or play a role in creating, an electrical signal in response to the physical signal (e.g., in a microphone), or to create a physical signal (e.g., an acoustic signal) in response to an applied electrical signal (e.g., as a speaker). For example, in some transducers the diaphragm is a membrane that moves relative to a backplate, for example because the membrane is flexible, and/or because the membrane is suspended from a substrate by flexures. As another example, in some transducers the diaphragm includes a set of cantilevered plates that flex independently in response to an impinging acoustic signal, and which create an electrical signal due to the piezo effect.

FIG. 1A and FIG. 1B schematically illustrate a prior art microphone system 100. The system 100 includes a microphone (e.g. a MEMS microphone) 110 mounted on a system substrate (which may be a printed circuit board) 120, along with an application specific integrated circuit ("ASIC") 130. In this illustration the microphone 110 defines a frontside cavity 111 have a width (in this embodiment, 960 μm).

A cover 140 mounted on the printed circuit board 120 covers the microphone 110 and an application specific integrated circuit ("ASIC") 130 coupled to, and configured to receive an electrical signal from, the microphone 110.

The printed circuit board 120 includes an acoustic aperture 121 disposed to align with the microphone 110, and specifically with the frontside cavity 111, to allow acoustic energy (e.g., an acoustic signal) from outside the system 100 to impinge on the microphone 110. The acoustic aperture has a width (in this embodiment, 750 μm). As shown in FIG. 1A and FIG. 1B, the acoustic aperture 121 and the frontside cavity 111 combine to form an uninterrupted channel from the space external to the system 100 to the transducer 112 of the microphone 110.

FIG. 2A schematically illustrates an embodiment of a robust MEMS transducer system 200.

The MEMS transducer system 200 has a topside 213, and a substrate 210 having a top surface 211 and bottom surface 212, and a thickness defined as the distance between top side 213 and the bottom surface 212. In illustrative embodiments, the substrate 210 is silicon, but in other embodiments may be other semiconductor or other material. In some embodiments, the top side 213 of the MEMs transducer 200 is also the top surface 211 of the substrate 210. In the illustrative embodiment of FIG. 2A, the thickness 215, defined as the distance between the top surface 211 of the substrate and the bottom surface 212 of the substrate, the is 400 μm.

The MEMS transducer 200 also has transducer element 230 disposed in or at the top surface 211 of the substrate 210. The transducer element 230 may be described as being in or at the top layer of the substrate 210. The transducer element 230 may be any of a variety of transducers known in the art, including without limitation a capacitive transducer having a backplate 291 and a flexible diaphragm 290, or a piezo transducer, to name but a few examples.

Figure 2B:
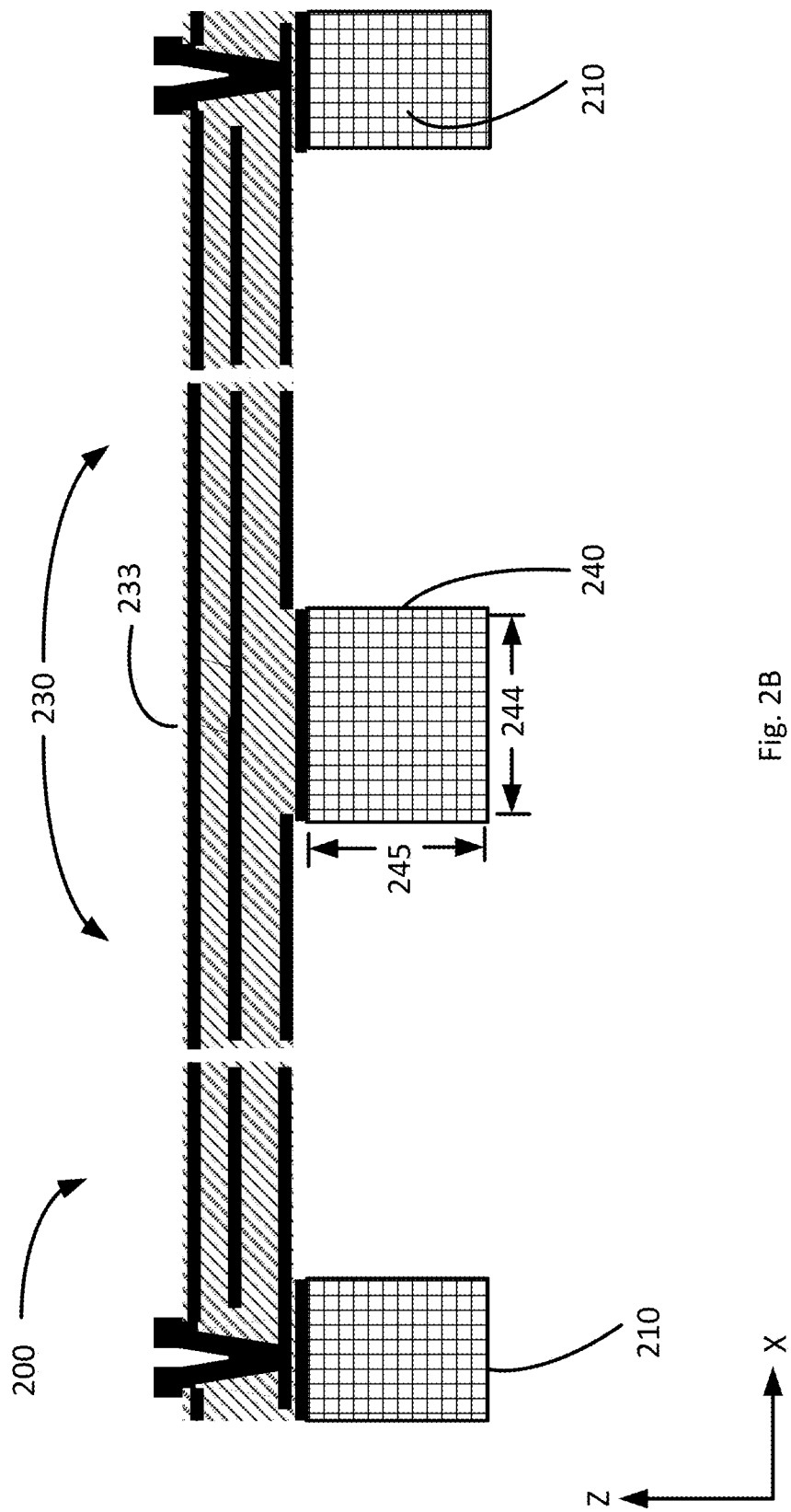
FIG. 2B schematically illustrates a cross-section of an embodiment of a robust MEMS transducer.
Figure 2C:
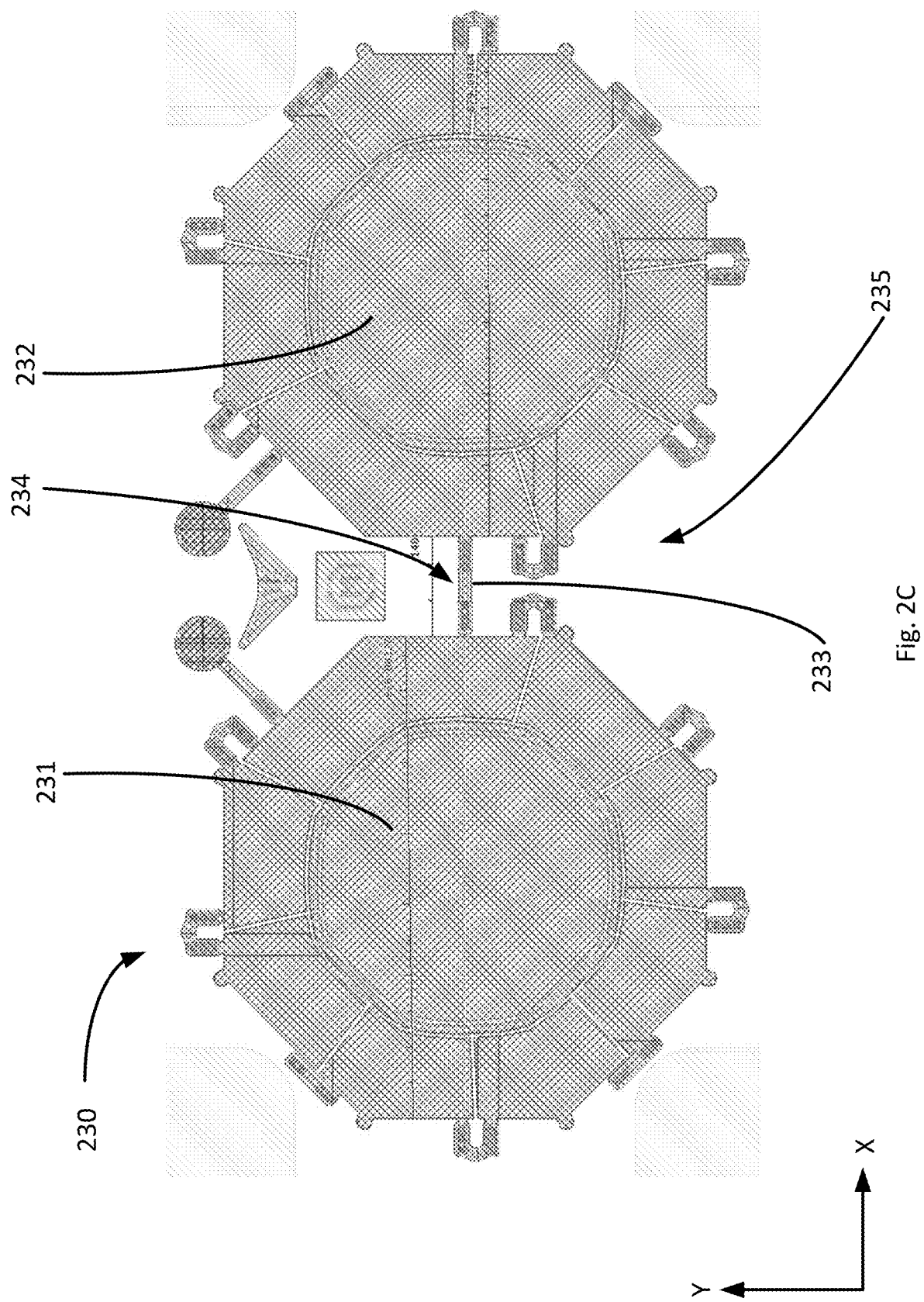
FIG. 2C schematically illustrates an embodiment of a two-diaphragm transducer.

Although the transducer element 230 is a single transducer, in some embodiments the sub-includes two transducer elements, such as a first transducer sub-element 231 and a second transducer sub-element 232, as schematically illustrated in FIG. 2C, which transducer elements sub-elements 231, 232 form the single transducer element 230. For example, in some embodiments having two transducer sub-elements 231, 232, the transducer sub-elements 231, 232 are electrically coupled to act, in response to an incident acoustic signal, as a single transducer. To that end, in some embodiments, the two transducer sub-elements 231, 232 may be electrically coupled to one another by a conductive coupler 233. In some embodiments, the transducer sub-elements 231, 232 are coupled to one another so as to sum the individual signals generated by the transducer sub-elements 231, 232. For example, in illustrative embodiments the transducer sub-elements 231, 232 are configured or coupled in electrical parallel to form a single capacitor.

In some embodiments, the transducer sub-elements 231, 232 are disposed on either side of a bridge 235, such that the bridge 235 extends between the first transducer sub-element 231 and the second transducer sub-element 232. One such embodiment is schematically illustrated in FIG. 2C.

The MEMS transducer 200 also has a frontside cavity 220. The frontside cavity 220 extends into the substrate 210 from the bottom surface 212 and exposes the transducer 230 through the substrate 210. Illustrative embodiments of the frontside cavity 220 have two portions (221, 222) described below. In illustrative embodiments, the frontside cavity 220 forms an aperture in the bottom surface 212 of the substrate 210.

The MEMS transducer 200 also has an energy diverter 240 disposed within the frontside cavity 220. The energy diverter 240 may also be referred-to as an "energy attenuator." The energy diverter 240 diverts kinetic energy in a mass of fluid (e.g., air) as the mass of fluid moves into the frontside cavity 220 towards the transducer 230. Consequently, the energy diverter 240 may be referred-to as a "kinetic" energy diverter 240 in which the adjective "kinetic" refers to the energy that is diverted. In illustrative embodiments the energy diverter 240 is a static structure.

Figure 2D:
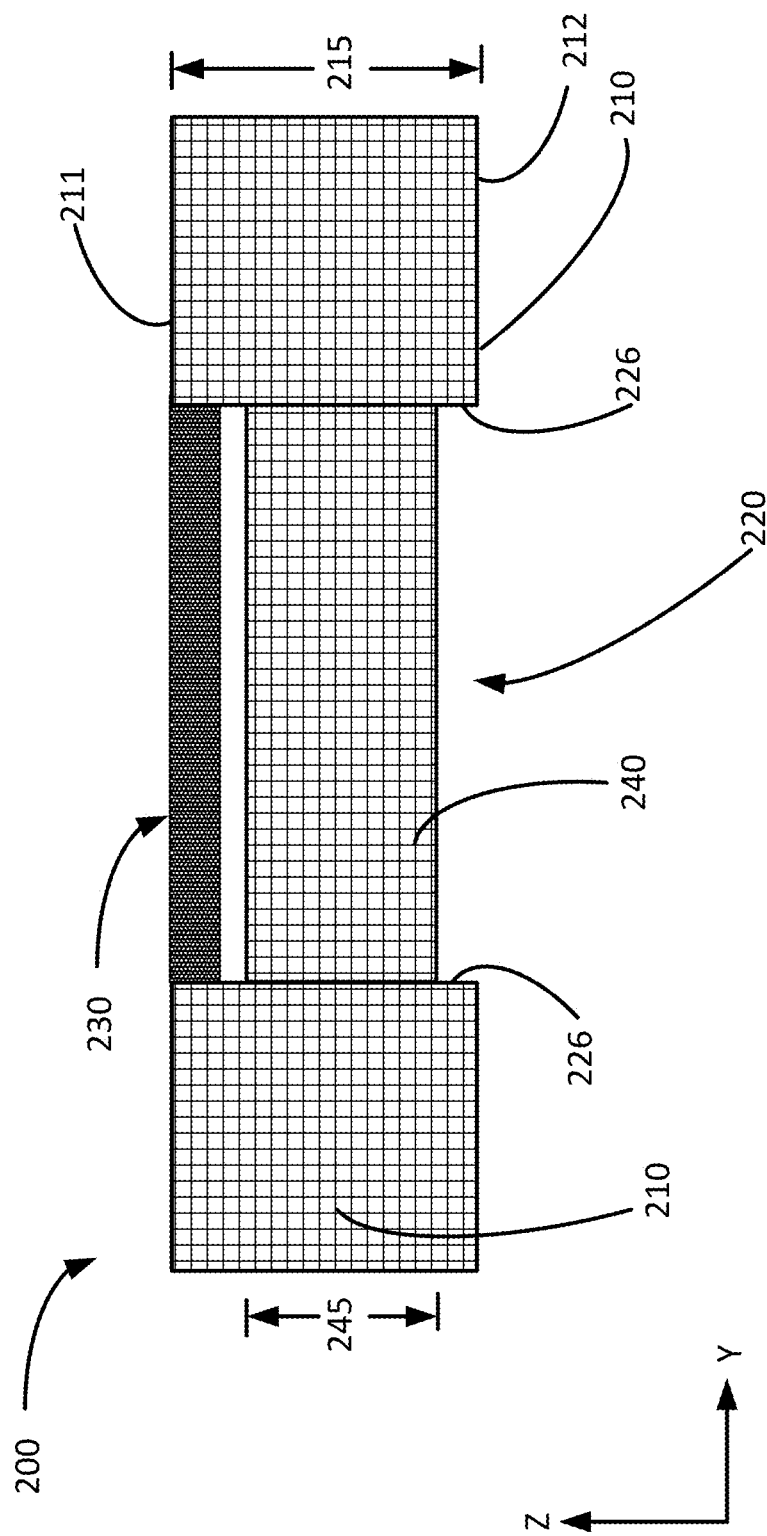
FIG. 2D schematically illustrates a cross-section of another embodiment of a robust MEMS transducer.
Figure 2E:
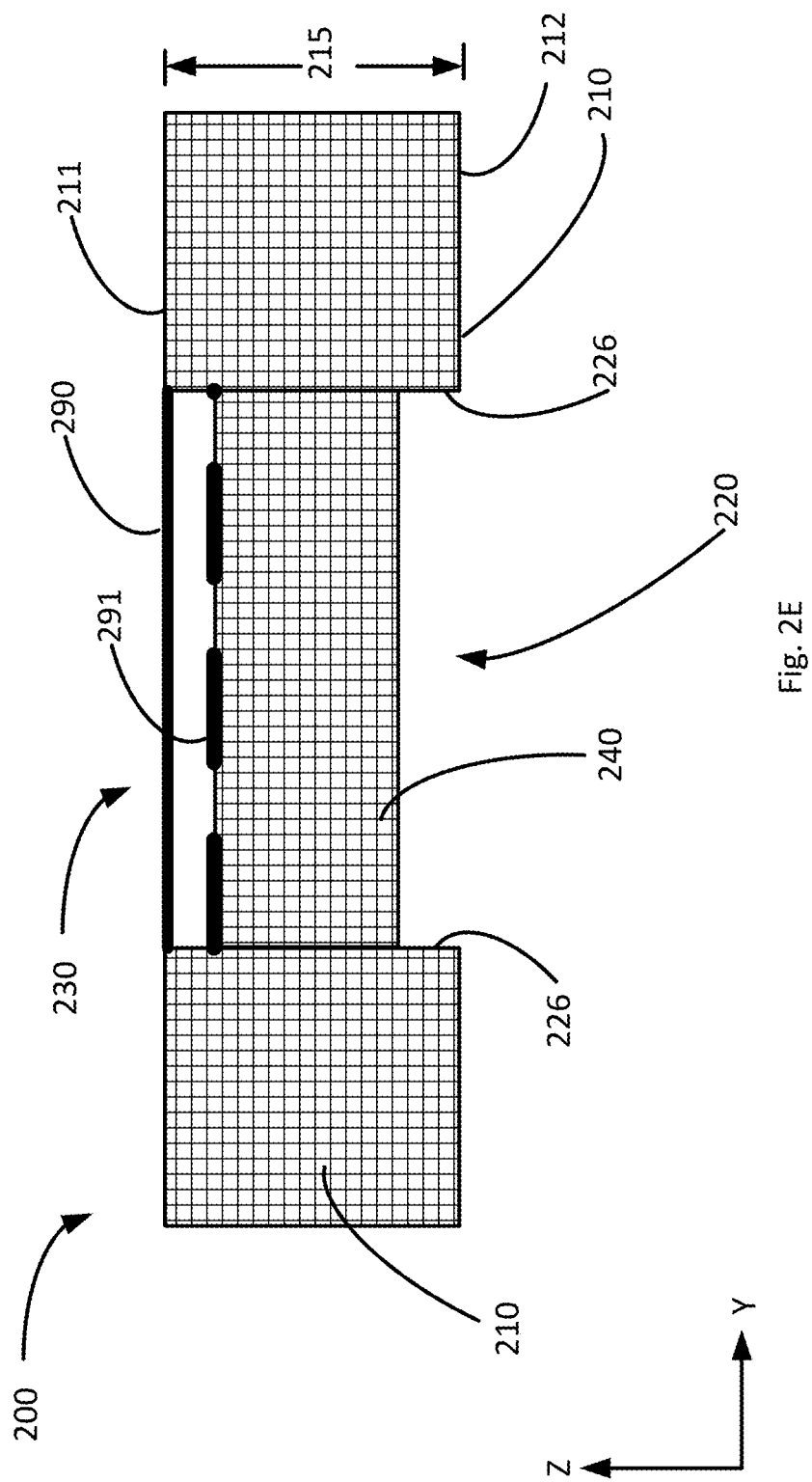
FIG. 2E schematically illustrates a cross-section of another embodiment of a robust MEMS transducer.

In illustrative embodiments, the energy diverter 240 is contiguous with the top layer extends into the frontside cavity 220 from the top layer of the transducer substrate 210. In some illustrative embodiments that include a bridge 235, the energy diverter 240 is contiguous with the bridge 235, and extends into the frontside cavity 220 from the bridge 235. In other words, in some embodiments the energy diverter 240 is suspended into the frontside cavity 220 from the bridge 235. See, for example, the embodiment in FIG. 2A. In some embodiments, the diverter 240 is suspended from sidewalls 226 of the frontside cavity 220 in addition to being suspended from the bride 235. In other embodiments, such as the embodiment schematically illustrated in FIG. 2D, the diverter 240 is suspended from sidewalls 226 of the frontside cavity 220, and not from the bridge 235. In embodiments in which the transducer element 230 is a capacitive microphone having a flexible diaphragm 290 and a backplate 291, wherein the backplate 291 is disposed between the diaphragm 290 and the frontside cavity 220 such as the embodiment schematically illustrated in FIG. 2E, the diverter 240 may be suspended from the backplate 291. In illustrative embodiments, the diverter 240 is disposed in line with the geometric center 234 of the movable diaphragm(s) of the transducer 230, as schematically illustrated in FIG. 2A, for example. In illustrative embodiments in which the transducer 230 includes a backplate 291 (e.g., as schematically illustrated in FIG. 2E, as just one example), the energy diverter 240 is disposed such that kinetic energy entering the frontside cavity 220 from outside of the transducer 200 reaches the energy diverter 240 before it reaches the backplate 291.

The diverter 240 defines two portions 221, 222 of the frontside cavity 220, each portion 221, 222 associated with and providing an acoustic path to the transducer 230. See, for example, the embodiment in FIG. 2A. For example, in embodiments having two transducer elements 231, 232, each such portion 221, 222 of the frontside cavity 220 may be associated with, and provide an acoustic path to, a corresponding one of the transducer elements 231, 232. Such embodiments may be described as having a frontside cavity 220 having a plurality of portions 221, 222 separated by the rigid kinetic energy diverter 240, each portion of the plurality of portions 221, 222 exposing an underside of a transducer structure 230 through the frontside cavity 220.

The diverter 240, in conjunction with sidewalls 226, defines a width of such portions 221, 222. For example, as schematically illustrated in FIG. 2A, the width of each portion 221, 222 extends 660 μm from a sidewall 226 of the frontside cavity 220 to a facing sidewall 246 of the diverter 240. The width of the diverter 240, in this embodiment, is 160 μm.

In illustrative embodiments, each portion 221, 222 of the frontside cavity 220 has the same physical length so that such portions 221, 222 do not change the relative phases of portions of an acoustic signal as the acoustic signal propagates through the frontside cavity 220 to the transducer 230. The portions 221, 222 in such embodiments may be described as having the same acoustic length.

In operation, as a mass of moving air having kinetic energy moves into and through the frontside cavity 220 in the direction of the transducer 230, the mass of air first encounters the end (or bottom face) 241 of the energy diverter 240. In some embodiments the bottom face 241 of the diverter 240 is flat. In some embodiments the bottom face 241 of the diverter 240 is concave, and in some embodiments the bottom face 241 of the diverter 240 is convex.

Some of that kinetic energy is reflected by the end 241 of the energy diverter, and/or some of that kinetic energy may be absorbed by the end 241 of the energy diverter 240 and/or by one or more side surfaces 246 of the energy diverter 240. Some of that energy is diverted or redirected, for example into a sidewall 226 or into other air atoms, such that it does not directly impact the diaphragm 290. Consequently, the kinetic energy of the mass of air is attenuated in that at least some of the kinetic energy in the mass of air is prevented from reaching, or at least prevented from directly impacting, the transducer 230.

To those ends, the bottom face 241 of the diverter 240 is suspended in the frontside cavity 220 in a location such that a mass of air entering into and moving through the frontside cavity 220 will impinge on the bottom face 241 of the diverter 240 at a location such that the diverter 240 sufficiently redirects, diverts, or attenuates the kinetic energy to protect the transducer 230 as described above. If the bottom face 241 of the diverter 240 is too close to the transducer 230, it may not sufficiently redirect, divert, or attenuate that kinetic energy, so in illustrative embodiments the diverter 240 is disposed in the frontside cavity so that kinetic energy reaches the bottom face 241 prior to reaching the transducer 230.

In illustrative embodiments, the bottom face 241 of the diverter 240 is disposed at least halfway between the transducer 230 (or bridge 235) and the bottom surface 212 of the substrate 220. In some embodiments, such as in FIG. 2A, the energy diverter 240 extends through the frontside cavity 220 such that the bottom face 241 of the diverter 240 is parallel to the bottom surface 212 of the substrate 210. In other words, in some embodiments the energy diverter 240 extends through the frontside cavity 220 such that the bottom face 241 of the diverter 240 extends to a plane defined by the bottom surface 212.

In some embodiments, the distance between the top surface of the substrate and the bottom surface of the substrate defines a thickness of the substrate. In some embodiments, the rigid kinetic energy diverter 240 extends from the top layer of the substrate, or top surface of the substrate, into the frontside cavity a distance of at least half of the substrate thickness. In some embodiments, the rigid kinetic energy diverter 240 extends from the top layer of the substrate, or top surface of the substrate, into the frontside cavity a distance of at least three-quarters of the substrate thickness. In some embodiments, the rigid kinetic energy diverter 240 extends from the top layer of the substrate, or top surface of the substrate, into the frontside cavity all the way to the bottom surface of the substrate.

The energy diverter 240 has a height 245 as measured in a direction extending from the bottom surface 212 of the substrate 210 towards the top surface 211 of the substrate 210. In some embodiments, the height 245 of the energy diverter 240 is equal to the thickness 215 of the substrate 210. In other embodiments, the height 245 of the energy diverter 240 is less than half of the thickness 215 of the substrate 210. For example, in illustrative embodiments, the height 245 of the energy diverter 240 may be 0.45 times the thickness 215 of the substrate 210, or 0.40 times the thickness 215 of the substrate 210, or 0.35 times the thickness 215 of the substrate 210, or 0.30 times the thickness 215 of the substrate 210, or 0.25 times the thickness 215 of the substrate 210, to name but a few examples. In other embodiments, the height 245 of the energy diverter 240 is at least half of the thickness 215 of the substrate 210. For example, in illustrative embodiments, the height 245 of the energy diverter 240 may be half of the thickness 215 of the substrate 210; three-quarters of the thickness 215 of the substrate 210; 0.6 times the thickness 215 of the substrate 210, 0.7 times the thickness 215 of the substrate 210, 0.8 times the thickness 215 of the substrate 210, or 0.9 times the thickness 215 of the substrate 210, to name but a few examples.

The energy diverter 240 also has a width 244, measured in a direction normal to the height 245, as schematically illustrated in FIG. 2B, for example. In some embodiments, the width 244 is defined in a direction parallel to the top surface 211 of the substrate 210. The energy diverter 240 has an aspect ratio in cross-section, which is defined as the ratio of its height 245 to its width 244. In illustrative embodiments, the height 245 of the energy diverter 240 is greater than the width 244 of the energy diverter 240, and so its aspect ratio if greater than one, but the aspect ratios is less than 100. For example, in some embodiments, the aspect ratio is greater than 2; in some embodiments the aspect ratio is greater than 3; in some embodiments the aspect ratio is greater than 4; in some embodiments the aspect ratio is greater than 5.

The inventors have found that acoustic energy (e.g., energy in an acoustic signal) propagating into the frontside cavity 220 is not significantly dampened by the energy diverter 240. All, or substantially all, of that acoustic energy passes into and through the frontside cavity and reaches and impinges upon the transducer 230 (e.g., transducer elements 232, 232). This is in contrast to the kinetic energy of moving air, which is dampened or diverted by the energy diverter 240.

Consequently, the MEMS transducer 200 of FIG. 2A, FIG. 2B, FIG. 2C, 2D and FIG. 2E may be described as being more robust than prior art microphone 110 in that the MEMS transducer 200 can withstand a drop (such as a drop described above, for example) without incurring (or at least being less susceptible to) the damage described above, and while retaining its characteristics as a transducer (e.g., a speaker or a microphone).

In practice, the MEMS transducer 200 is most likely fabricated as part of a wafer having a plurality of such MEMS transducers 200. After completion of the fabrication of such a wafer, the wafer is diced (as known in the art) to segregate the plurality of such MEMS transducers 200 into separate, individual devices, each having a transducer 230 and frontside cavity 220 as described above in connection with FIG. 2A, FIG. 2B, FIG. 2C, 2D and FIG. 2E.

Figure 3A:
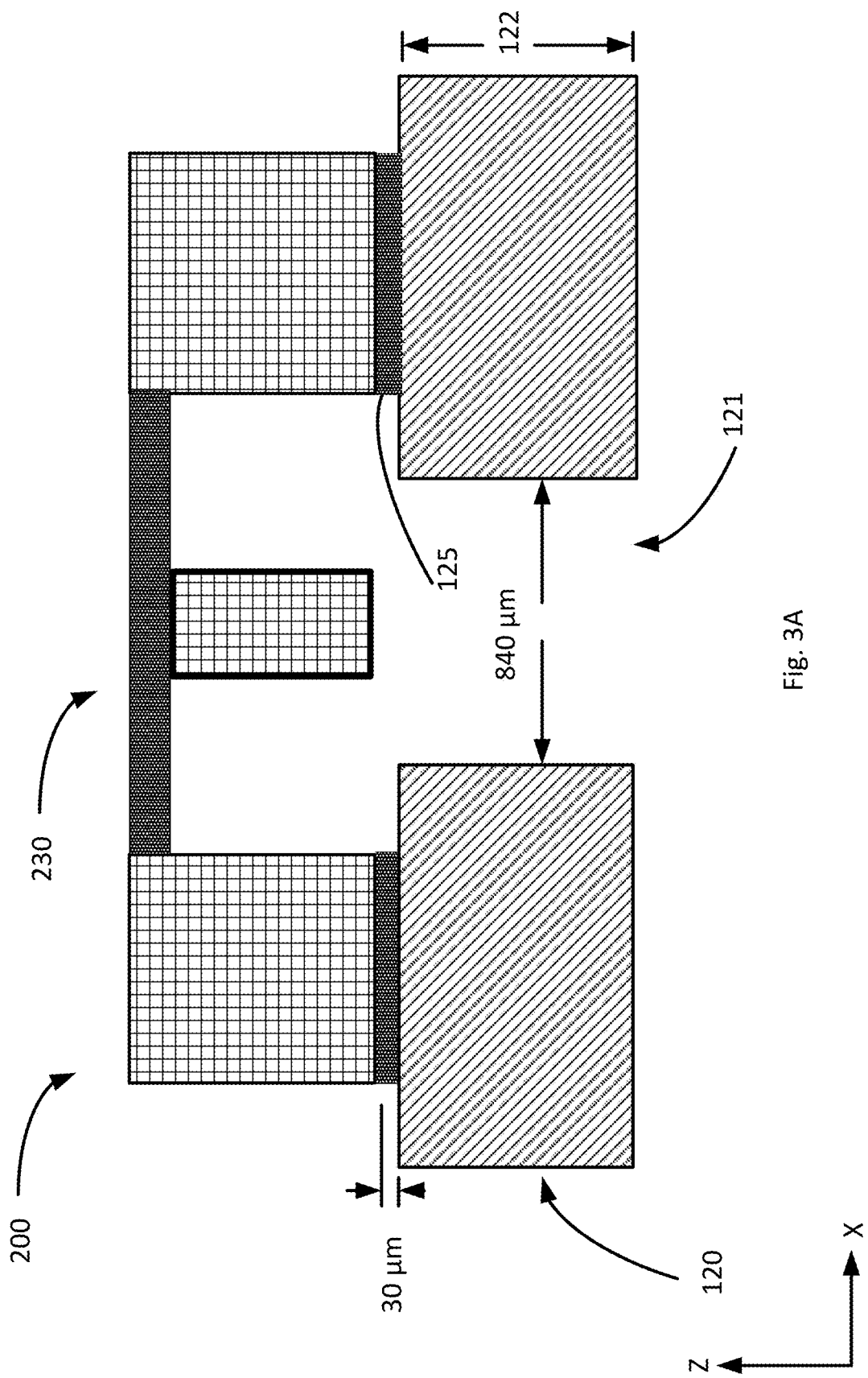
FIG. 3A schematically illustrates a cross-section of an embodiment of a robust MEMS transducer on a substrate.

FIG. 3A schematically illustrates a MEMS transducer 200, according to the embodiments described above, coupled to a system substrate 120, represented in FIG. 3A by printed circuit board having a thickness 122 (in this embodiments, the thickness is 200 μm), and having an acoustic aperture 121.

The MEMS transducer 200 is coupled to the system substrate 120 by die attach 125.

Figure 3B:
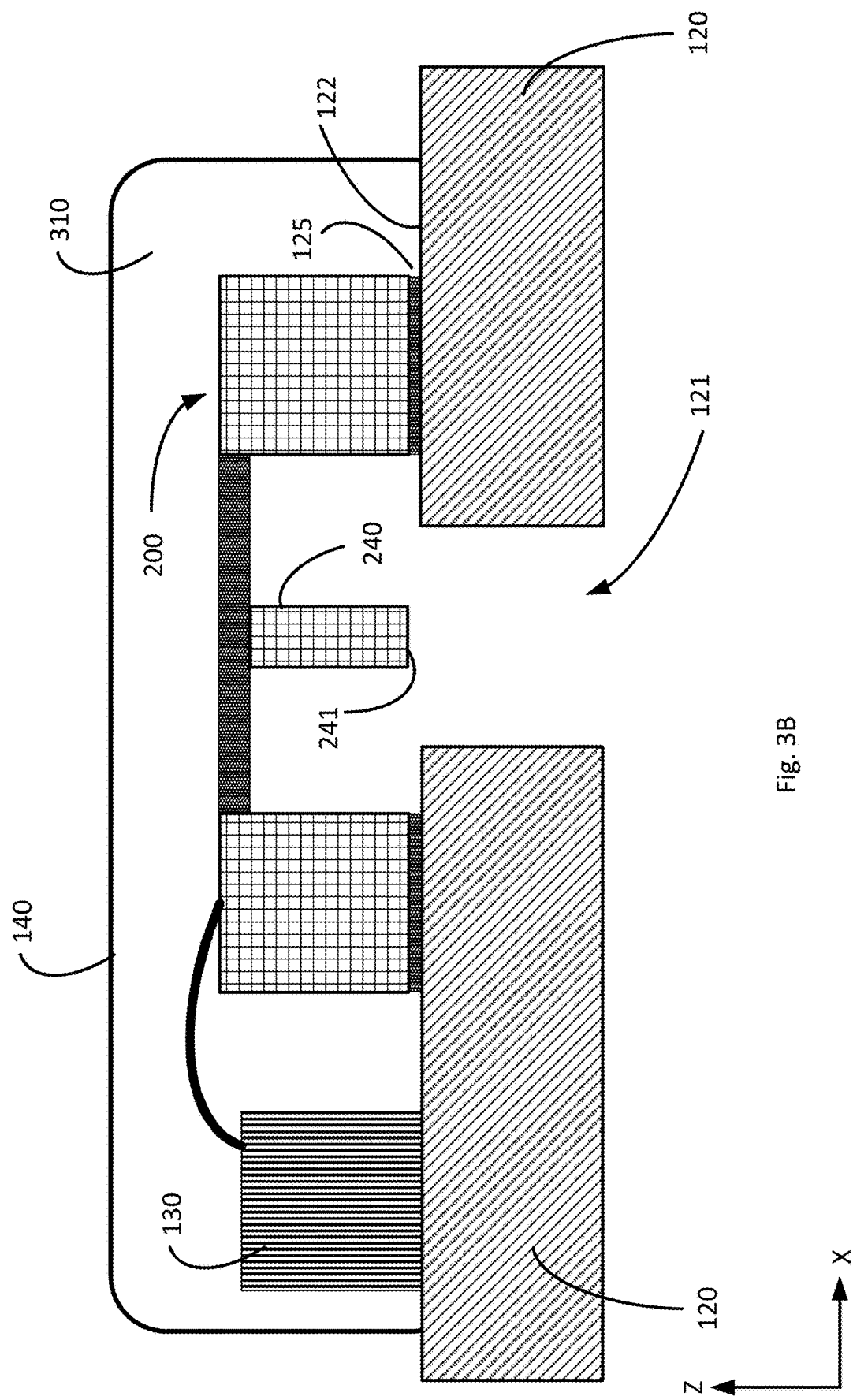
FIG. 3B schematically illustrates a cross-section of an embodiment of a packaged robust MEMS transducer.

FIG. 3B schematically illustrates a cover 140 coupled to the system substrate 120 and enclosing the MEMS transducer 200 within an interior volume (or "package volume") 310. This embodiment also includes an ASIC 130 enclosed within the interior volume 310. The ASIC is in electrical communication with the transducer 200, and is configured to receive and process signals output from the transducer 200.

Fabrication

Figure 4A:
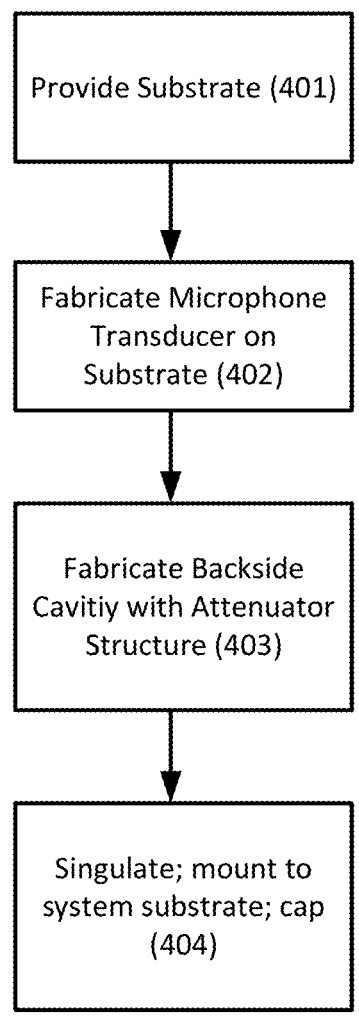
FIG. 4A is a flowchart of a process of fabricating an embodiment of a robust MEMS transducer.

A method of fabricating a robust MEMS transducer according to the foregoing embodiments is illustrated by the flowchart in FIG. 4A, and includes providing a substrate (step 401), fabricating a transducer 230 on or in the substrate (step 402), and fabricating the frontside cavity 220, including the diverter structure 240 (step 403). The diverter structure may be any of the energy diverters 240 described herein. Some embodiments also include step 404, which includes dicing the wafer to singulate the transducer 200 from the wafer (for embodiments in which the transducer 200 is fabricated as part of a wafer), and may also include securing the transducer 200 over an acoustic aperture to a system substrate 120, and capping the transducer by securing a cover (or cap) 140 over the transducer 200.

Figure 4B:
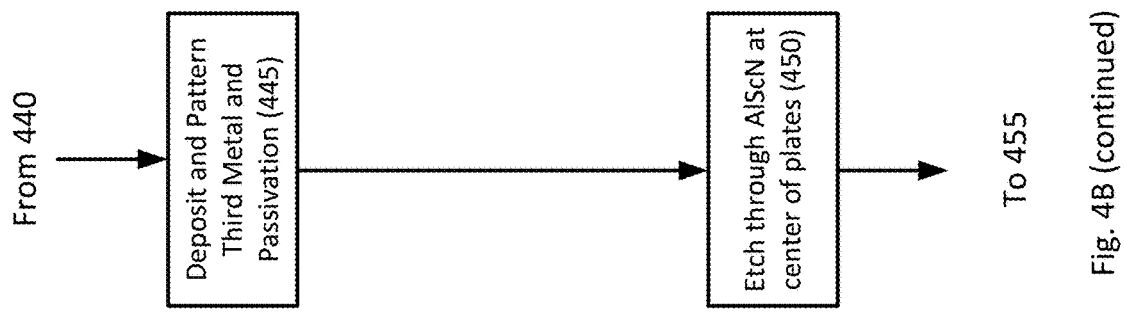
FIG. 4B is a flowchart of a process of fabricating an embodiment of a robust MEMS transducer.

FIG. 4B is a flowchart illustrating a method 410 of fabricating a robust MEMS transducer 200. FIG. 5A, FIG. 5B, FIG. 5C, FIG. 5D, FIG. 5E, FIG. 5F, FIG. 5G, FIG. 5H, and FIG. 5I each schematically illustrates a cross-section of an embodiment of a robust MEMS transducer 200 at various stages of fabrication. For illustrative purposes, the transducer 200 schematically illustrated in FIG. 5A, FIG. 5B, FIG. 5C, FIG. 5D, FIG. 5E, FIG. 5F, FIG. 5G, FIG. 5H, and FIG. 5I is a piezo microphone, but the type of transducer 200 does not limit the fabrication of the diverter 240.

Step 415 includes providing a starting wafer. An embodiment of a starting wafer 500 is schematically illustrated in FIG. 5A. In this embodiment, the starting wafer 500 includes a semiconductor (e.g., silicon) substrate 210 having a top surface 213 and a bottom surface 212. In this embodiment, the starting wafer 500 includes a silicon dioxide (SiO2) layer 505 disposed on and covering its top surface 213, and a metal layer ("Metal 1") 506 disposed on the silicon dioxide layer 505. The first metal layer 506 (and the second metal layer 515 and the third metal layer 545, as described herein) may be or include molybdenum, for example.

Step 420 includes patterning the first metal layer 506 to form a patterned first metal layer, as schematically illustrated in FIG. 5B.

Step 425 includes adding a first layer of piezoelectric material (e.g., aluminum scandium nitride (AlScN)) 510 over the patterned first metal layer 506, followed by adding a second metal layer ("Metal 2") 515 above the first piezoelectric material layer 510, as schematically illustrated in FIG. 5C.

Step 430 patterns the second metal layer 515 to form a patterned second metal layer 515, as schematically illustrated in FIG. 5D.

Step 435 includes adding a second layer of piezoelectric material 530 covering the pattered second metal layer 515, as schematically illustrated in FIG. 5E.

Step 440 includes pattering the second piezoelectric material layer 530 to expose a portion of the pattered second metal layer 515 in a first cavity 532, and patterning the piezoelectric material 510 and to expose a portion of the pattered first metal layer 506 in a first cavity 531, as schematically illustrated in FIG. 5F.

Figure 5G:
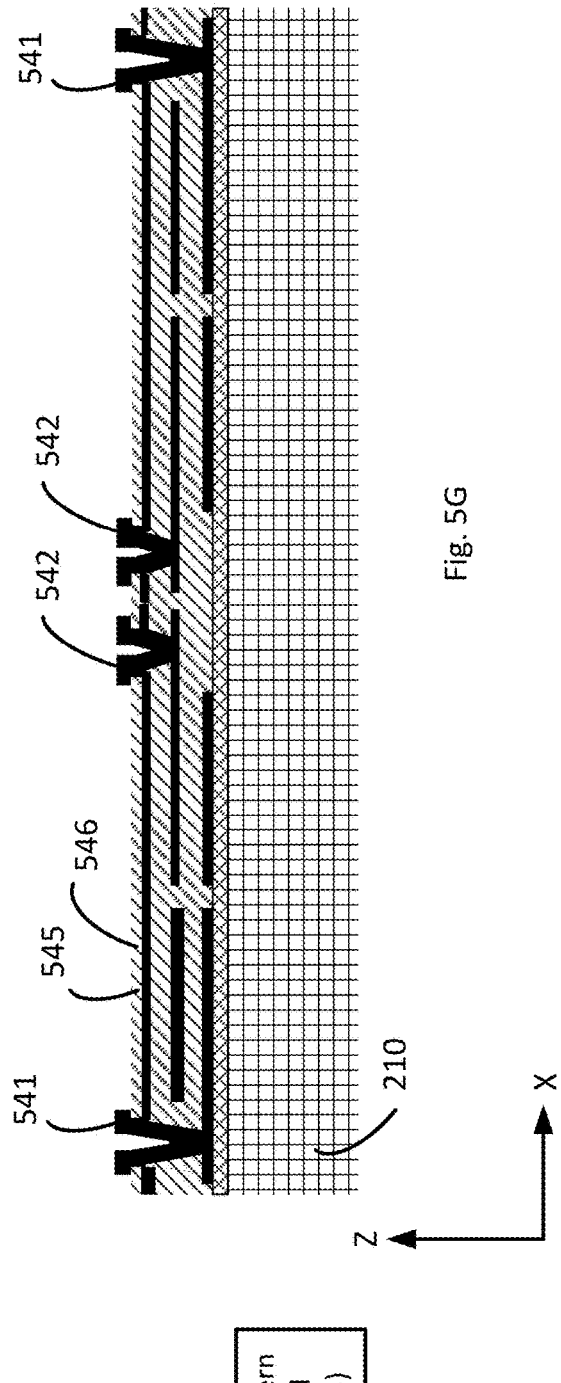

Step 445 includes depositing a third metal layer 545, and subsequently depositing a passivation layer 546 (e.g., AlN) over the third metal layer 545, as schematically illustrated in FIG. 5G. Step 445 also includes patterning the passivation layer 546 and the third metal layer 545 to expose the cavities 531, 532, an then depositing a metal in the cavities 531, 532 to form vias 541, 542, as also schematically illustrated in FIG. 5G. In illustrative embodiments, the vias 541, 542 may be or include a conductive alloy of aluminum and copper (e.g., AlCu).

Figure 5H:
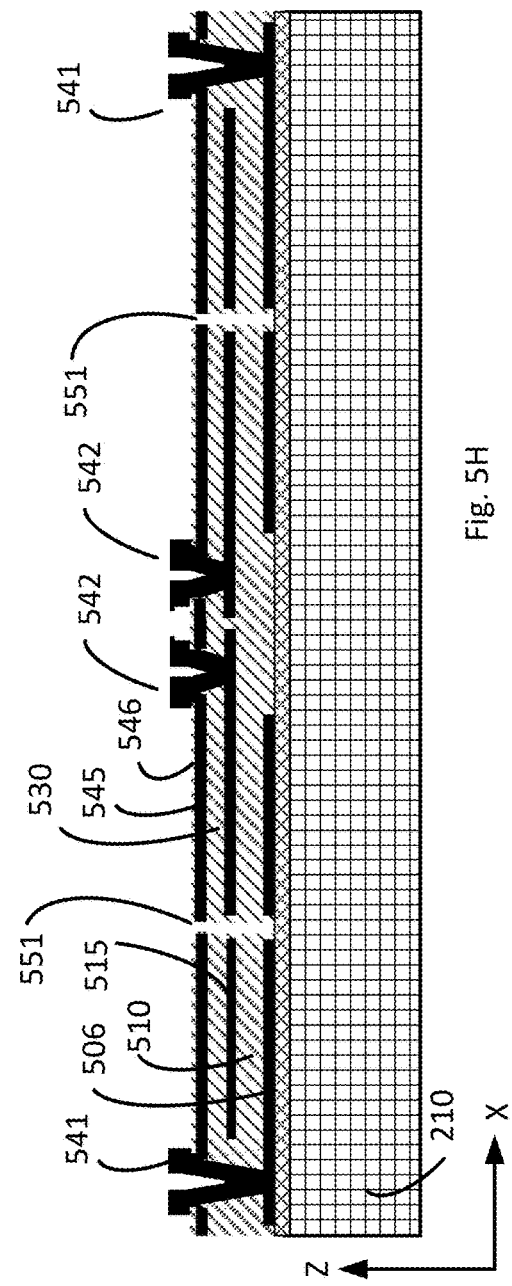

At step 450, the method 410 includes etching a cavity (or "diaphragm cavity") 551 through the passivation layer 546, the third metal layer 545, the second piezoelectric material layer 530, the second metal layer 515, the first piezoelectric material layer 510 and the first metal layer 506, as schematically illustrated in FIG. 5H.

The method 410 also includes etching the frontside cavity 220 (e.g., portions 221, and 222) at step 455, as schematically illustrated in FIG. 5I. It should be noted that step 455 includes forming the energy diverter 240 by selective etching, the energy diverter 240 formed by leaving a portion of the substrate 210. In other words, said etching leaves a portion of the substrate to form the diverter structure. In the embodiment of FIG. 5I, the frontside cavity 220 meets with the diaphragm cavity 551 to form a diaphragm aperture 561.

Step 460 includes an oxide etch and release, to produce the MEMS transducer 200, e.g., resulting in a movable diaphragm. In some embodiments, step 460 also includes dicing the wafer to singulate the transducer 200 from the wafer. In some embodiments, step 460 may also include securing the transducer 200 over an acoustic aperture to a system substrate 120, and capping the transducer by securing a cover (or cap) 140 over the transducer 200.

Figure 6C:
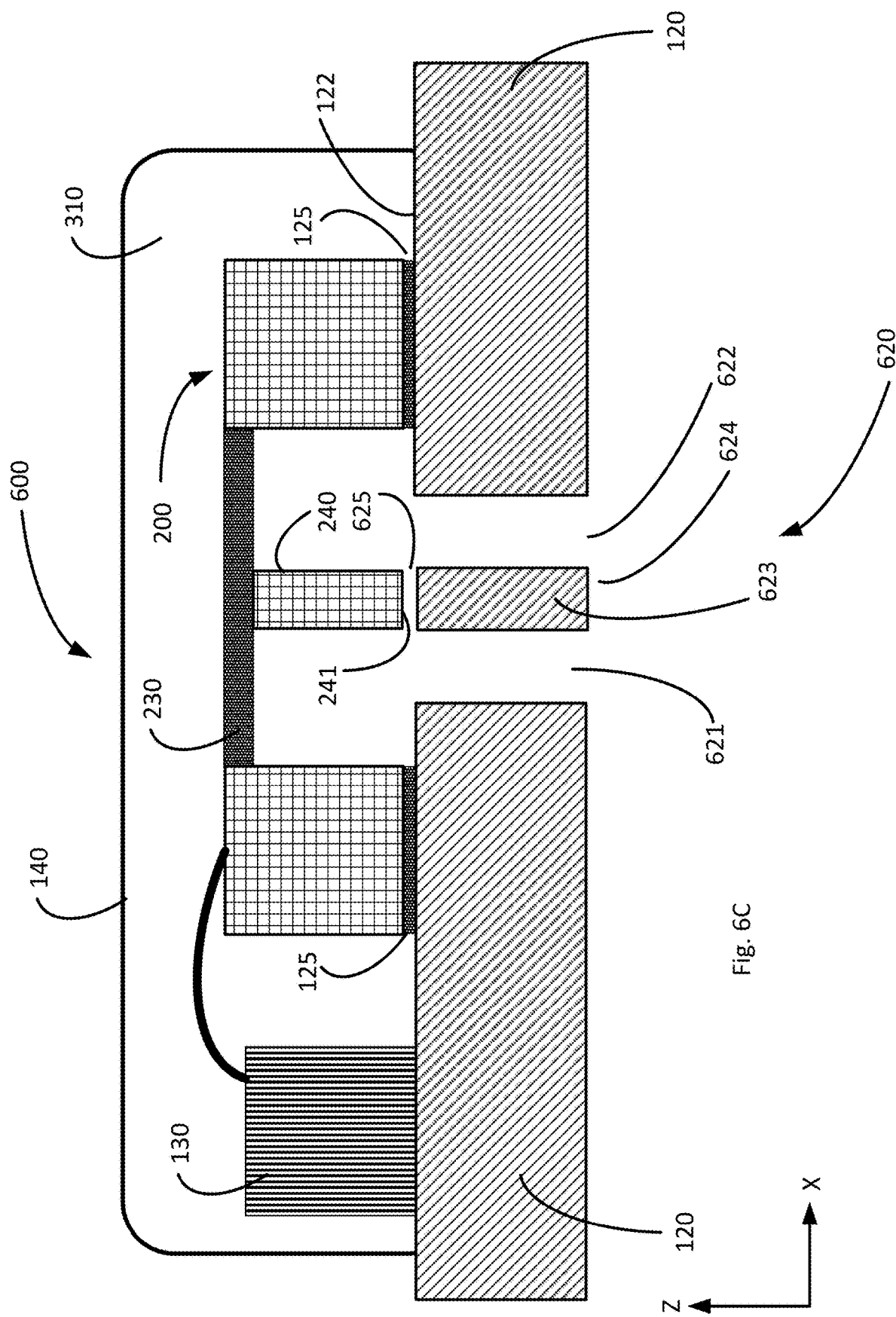

FIG. 6A, FIG. 6B and FIG. 6C schematically illustrate an alternate embodiment of a transducer system 600 including a transducer 600 (which may be a microphone, for example) and a package substrate 120.

The transducer 610 may be a transducer 200 as shown in the figures and described above, but is not required to be such a transducer.

The transducer 620 has frontside cavity 611, and a transducer element 630 having a movable diaphragm 613, the movable diaphragm 613 exposed to the frontside cavity 611.

The system substrate 120 has an acoustic aperture system 620 having a plurality of aperture portions 621, 622.

The acoustic aperture system 620 also has a rigid septum 623 that spans the acoustic aperture system 620. In illustrative embodiments, the rigid septum 623 is defined by the plurality of aperture portions 621, 622. The rigid septum 623 is configured to attenuate and/or redirect (e.g., reflect) kinetic energy of a mass of air moving toward the diaphragm. To that end, the rigid septum 623 has an exposed face 624 distal from the moveable diaphragm 613.

The two aperture portions 621, 622 each pass an incoming acoustic signal from outside the system 600 into the frontside cavity 611 of the MEMS transducer 610. The two aperture portions 621, 622 and the septum 623 do not have a detrimental impact on the propagation of acoustic energy into the frontside cavity 611.

The transducer 610 is affixed on the system substrate 120 with the frontside cavity 611 covering the acoustic aperture system 620, such that an acoustic signal may pass through each of the plurality of aperture portions 621, 622 and reach the moveable diaphragm 613. In illustrative embodiments, the transducer 610 is coupled to a top surface 122 of the system substrate 120 by die attach 125. In some embodiments, the energy diverter 240 is aligned with the septum 623 such that a straight line normal to the top surface 122 of the system substrate 120 would pass through both the energy diverter 240 and the septum 623. See, for example, the locations of the energy diverter 240 and the septum 623 as schematically illustrated in FIG. 6C

In some embodiments, such as the embodiment schematically illustrated in FIG. 6C, the transducer 600 is a transducer 200 as schematically illustrated in FIG. 2A. To that end, the transducer has a rigid kinetic energy diverter 240 configured to redirect and/or attenuate the kinetic energy of the mass of air moving toward the movable diaphragm. As described above, the rigid kinetic energy diverter 240 is disposed within the frontside cavity and extends into the frontside cavity in a direction away from the movable diaphragm. The kinetic energy diverter 240 has its exposed end 241 distal from the transducer 230, such that the exposed distal end 241 is nearer to the septum 623 than it is to the transducer 230. Some embodiments include a gap 625 between the end 241 of the energy diverter 240 and the septum 623, which gap 625 has a thickness equal to the thickness of die attach 125 that secures the transducer 610 to the system substrate 120.

Some embodiments also include a cover 140 secured to the system substrate 120, the cover and the system substrate defining a package volume 310, wherein the transducer 200 is affixed to the system substrate 120 within the package volume 130 along with an ASIC 130 electrically coupled to the transducer 200 to receive an electrical output produced by the transducer 200 in response to an acoustic signal entering the system 600 through the acoustic aperture system 620.

A listing of certain reference numbers is presented below.
- 100: Prior art microphone system;
- 110: Prior art MEMS microphone;
- 111: Frontside cavity of prior art microphone;
- 112: Transducer of prior art microphone;
- 120: Package substrate (e.g., printed circuit board ("PCB"));
- 121: Acoustic aperture in printed circuit board;
- 122: Thickness of package substrate (or "system" substrate);
- 124: Top surface of system substrate;
- 125: Die attach;
- 130: ASIC;
- 140: Cover;
- 200: MEMS transducer;
- 210: Substrate;
- 211: Top surface of transducer substrate;
- 212: Bottom surface of transducer substrate;
- 213: Top surface of transducer;
- 215: Thickness of transducer substrate;
- 220: Frontside cavity;
- 221: First portion of frontside cavity;
- 221: Second portion of frontside cavity;
- 226: Sidewall of frontside cavity;
- 230: Transducer element (or "transduction" element);
- 231: First transducer sub-element;
- 232: Second transducer sub-element;
- 233: Conductive coupler;
- 234: Geometric center of transducer;
- 235: Bridge;
- 240: Energy diverter;
- 241: End of energy diverter;
- 244: Width of energy diverter;
- 245: Height of energy diverter;
- 246: Side of energy diverter;
- 290: Diaphragm;
- 291: Backplate;
- 310: Package volume;
- 500: Starting wafer;
- 505: Silicon dioxide layer;
- 506: First metal layer;
- 510: First piezoelectric material layer;
- 515: Second metal layer;
- 530: Second piezoelectric material layer;
- 531: First cavity;
- 532: Second cavity;
- 541: First via;
- 542: Second via;
- 545: Third metal layer;
- 546: Passivation layer;
- 551: First diaphragm cavity;
- 552: Second diaphragm cavity;
- 561: First diaphragm aperture;
- 600: Transducer system;
- 610: Transducer;
- 611: Frontside cavity;
- 621: First portion of acoustic aperture;
- 622: Second portion of acoustic aperture;
- 623: Septum (or "span");
- 624: Face of septum.

Various embodiments may be characterized by the potential claims listed in the paragraphs following this paragraph (and before the actual claims provided at the end of this application). These potential claims form a part of the written description of this application. Accordingly, subject matter of the following potential claims may be presented as actual claims in later proceedings involving this application or any application claiming priority based on this application. Inclusion of such potential claims should not be construed to mean that the actual claims do not cover the subject matter of the potential claims. Thus, a decision to not present these potential claims in later proceedings should not be construed as a donation of the subject matter to the public.

Without limitation, potential subject matter that may be claimed (prefaced with the letter "P" so as to avoid confusion with the actual claims presented below) includes:

P1. A MEMS transducer comprising: a substrate having a top layer, and a bottom surface opposite the top layer; a frontside cavity extending into the substrate from the bottom surface; a transducer having a movable diaphragm disposed at the top layer of the substrate and exposed to the frontside cavity; and a rigid kinetic energy diverter configured to divert kinetic energy of a mass of air moving toward the movable diaphragm, the rigid kinetic energy diverter disposed within the frontside cavity and extending into the frontside cavity in a direction away from the movable diaphragm, the kinetic energy diverter having an exposed end distal from the diaphragm, such that the exposed distal end is nearer to the bottom surface than it is to the diaphragm.

P2. The MEMS transducer of P1, wherein the movable diaphragm comprises a first diaphragm and a second diaphragm, and wherein: the first diaphragm and the second diaphragm are separated by a bridge; the rigid kinetic energy diverter is suspended from the bridge; and the first diaphragm is electrically coupled to the second diaphragm to sum the individual outputs so that the first diaphragm and the second diaphragm form a single capacitor.

P3. The MEMS transducer of any of P1-P2, wherein the movable diaphragm has a geometric center, and the rigid kinetic energy diverter is disposed in line with the geometric center of the movable diaphragm.

P4. The MEMS transducer of any of P1-P3, wherein the exposed end of the rigid kinetic energy diverter is concave.

P5. The MEMS transducer of any of P1-P4, wherein the top layer and the bottom surface define a thickness of the substrate, and wherein the rigid kinetic energy diverter extends from the top layer into the frontside cavity a distance of at least one half of the substrate thickness.

P6. The MEMS transducer of any of P1-P5, wherein the rigid kinetic energy diverter extends through the frontside cavity so that the exposed end extends to a plane defined by the bottom surface.

P7. The MEMS transducer of any of P1-P6, wherein the rigid kinetic energy diverter is contiguous with the top layer.

P8. The MEMS transducer of any of P1-P7, wherein the frontside cavity has a plurality of portions separated by the rigid kinetic energy diverter, each portion of the plurality of portions exposing an underside of the transducer structure.

P9. The MEMS transducer of any of P1-P8, wherein the frontside cavity defines a set of sidewalls, and wherein the rigid kinetic energy diverter is suspended from the set of sidewalls.

P10. The MEMS transducer of P1-P9, further comprising a backplate forming a variable capacitor with the movable diaphragm, the backplate disposed between the frontside cavity and the movable diaphragm, and wherein the rigid kinetic energy diverter is suspended from the backplate.

P11. The MEMS transducer of P1-P10, wherein the substrate comprises a semiconductor material.

P12. The MEMS transducer of P1-P11, wherein the substrate comprises silicon.

P13. A method of fabricating a robust MEMS transducer, comprising: providing a starting substrate having a top surface and a bottom surface; fabricating a transducer structure in or on the top surface; and fabricating a frontside cavity extending inward from the bottom surface towards and to the transducer structure, the frontside cavity comprising an diverter structure suspended within the frontside cavity, the diverter structure having a bottom face, the bottom face being closer to the bottom surface of the substrate than to the transducer structure.

P14. The method of fabricating a robust MEMS transducer according to P13, wherein the substrate comprises a silicon substrate, and fabricating the frontside cavity comprises etching the frontside cavity into the bottom surface of the silicon substrate, the frontside cavity exposing an underside of the transducer structure.

P15. The method of fabricating a robust MEMS transducer according to any of P13-P14, wherein the frontside cavity has a plurality of portions separated by the diverter structure, each portion of the plurality of portions exposing the underside of the transducer structure.

P16. A transducer system comprising: a transducer having a transducer element and a frontside cavity, the transducer having a movable diaphragm exposed to the frontside cavity; a substrate, the substrate having: an acoustic aperture system comprising a plurality of aperture portions; and a rigid septum defined by the plurality of aperture portions, and spanning the acoustic aperture system, the rigid septum having an exposed face distal from the moveable diaphragm, the rigid septum configured to divert kinetic energy of a mass of air moving toward the diaphragm; the transducer affixed on the substrate with the frontside cavity covering the acoustic aperture system, such that an acoustic signal may pass through each of the plurality of aperture portions and reach the moveable diaphragm.

P17. A transducer system according to P16, wherein the transducer comprises a MEMS microphone, the MEMS transducer further comprising: a rigid kinetic energy diverter configured to divert the kinetic energy of the mass of air moving toward the movable diaphragm, the rigid kinetic energy diverter disposed within the frontside cavity and extending into the frontside cavity in a direction away from the movable diaphragm, the kinetic energy diverter having an exposed end distal from the diaphragm, such that the exposed distal end is nearer to the septum than it is to the diaphragm.

The embodiments of the invention described above are intended to be merely exemplary; numerous variations and modifications will be apparent to those skilled in the art. All such variations and modifications are intended to be within the scope of the present invention as defined in any appended innovations and/or any appended claims.

What is claimed is:

1. A MEMS transducer comprising:
   a semiconductor substrate having a top layer, and a bottom surface opposite the top layer;
   a frontside cavity extending into the substrate from the bottom surface and forming an aperture at the bottom surface;
   a transducer element having a movable diaphragm disposed at the top layer of the substrate and exposed to the aperture through the frontside cavity; and
   a rigid kinetic energy diverter configured to divert kinetic energy of a mass of air moving toward the movable diaphragm, the rigid kinetic energy diverter disposed within the frontside cavity and extending into the frontside cavity in a direction away from the movable diaphragm, the kinetic energy diverter having an end exposed to the aperture and distal from the diaphragm, wherein the rigid kinetic energy diverter extends through the frontside cavity so that the exposed end extends to a plane defined by the bottom surface.

2. The MEMS transducer of claim 1, wherein the movable diaphragm comprises a first diaphragm and a second diaphragm, the first diaphragm and a second diaphragm each configured to produce an electrical output in response to incident acoustic energy, and wherein:
   the first diaphragm and the second diaphragm are separated by a bridge;
   the rigid kinetic energy diverter is suspended from the bridge; and
   the first diaphragm is electrically coupled to the second diaphragm to sum the individual outputs so that the first diaphragm and the second diaphragm form a single capacitor.

3. The MEMS transducer of claim 1, wherein the movable diaphragm has a geometric center, and the rigid kinetic energy diverter is disposed in line with the geometric center of the movable diaphragm.

4. The MEMS transducer of claim 1, wherein the exposed end of the rigid kinetic energy diverter is concave.

5. The MEMS transducer of claim 1, wherein the distance between the top layer and the bottom surface defines a thickness of the substrate, and wherein the rigid kinetic energy diverter extends from the top layer into the frontside cavity a distance of at least one half of the substrate thickness.

6. The MEMS transducer of claim 1, wherein the rigid kinetic energy diverter is contiguous with the top layer.

7. The MEMS transducer of claim 1, wherein the frontside cavity has a plurality of portions separated by the rigid kinetic energy diverter, each portion of the plurality of portions exposing an underside of the transducer structure through the frontside cavity.

8. The MEMS transducer of claim 1, wherein the frontside cavity defines a set of sidewalls, and wherein the rigid kinetic energy diverter is suspended from the set of sidewalls.

9. The MEMS transducer of claim 1, further comprising a backplate forming a variable capacitor with the movable diaphragm, the backplate disposed between the frontside cavity and the movable diaphragm, and wherein the rigid kinetic energy diverter is suspended from the backplate.

10. A method of fabricating a robust MEMS transducer, comprising:
providing a starting substrate comprising a semiconductor substrate having a top layer, and a bottom surface opposite the top layer;
fabricating a transducer element having a movable diaphragm disposed at the top layer of the starting substrate; and
fabricating a frontside cavity, the frontside cavity forming an aperture in the bottom surface of the starting substrate and extending inward from the bottom surface towards and to the transducer element, the transducer element exposed to the aperture through the frontside cavity, the frontside cavity comprising a rigid kinetic energy diverter structure suspended within the frontside cavity, the rigid kinetic energy diverter structure having an exposed end, the rigid kinetic energy diverter configured to divert kinetic energy of a mass of air moving toward the movable diaphragm, the rigid kinetic energy diverter disposed within the frontside cavity and extending into the frontside cavity in a direction away from the movable diaphragm,
wherein the kinetic energy diverter structure extends through the frontside cavity so that the exposed end extends to a plane defined by the bottom surface.

11. The method of fabricating a robust MEMS transducer according to claim 10, wherein the starting substrate comprises a silicon substrate, and fabricating the frontside cavity comprises etching the frontside cavity into the bottom surface of the silicon substrate, the frontside cavity exposing an underside of the transducer structure, said etching leaving a portion of the substrate to form the kinetic energy diverter structure.

12. The method of fabricating a robust MEMS transducer according to claim 10, wherein the frontside cavity has a plurality of portions separated by the kinetic energy diverter structure, each portion of the plurality of portions exposing the underside of the transducer structure.

13. The method of fabricating a robust MEMS transducer according to claim 10, wherein a distance between the top surface and the bottom surface defines a thickness of the substrate, and wherein the rigid kinetic energy diverter extends from the top layer into the frontside cavity a distance of at least one half of the substrate thickness.

14. The method of fabricating a robust MEMS transducer according to claim 10, wherein a distance between the top surface and the bottom surface defines a thickness of the substrate, and wherein the rigid kinetic energy diverter extends from the top layer into the frontside cavity a distance of at least three-quarters of the substrate thickness.

15. A transducer system comprising:
a transducer having a transducer element, a transducer substrate and a frontside cavity, the transducer element having a movable diaphragm exposed to the frontside cavity;
a transducer system substrate in addition to the transducer substrate, the system substrate having:
an acoustic aperture system comprising a plurality of aperture portions; and
a rigid septum defined by the plurality of aperture portions, and spanning the acoustic aperture system, the rigid septum having an exposed face distal from the moveable diaphragm, the rigid septum configured to divert kinetic energy of a mass of air moving toward the diaphragm;
the transducer affixed on the substrate with the frontside cavity covering the acoustic aperture system, such that an acoustic signal may pass through each of the plurality of aperture portions and reach the moveable diaphragm.

16. A transducer system according to claim 15, wherein the transducer comprises a MEMS transducer, the MEMS transducer further comprising:
a rigid kinetic energy diverter configured to divert the kinetic energy of the mass of air moving toward the movable diaphragm, the rigid kinetic energy diverter disposed within the frontside cavity and extending into the frontside cavity in a direction away from the movable diaphragm, the kinetic energy diverter having an exposed end distal from the diaphragm, such that the exposed distal end is nearer to the septum than it is to the diaphragm.

17. A transducer system according to claim 15 wherein the transducer is affixed to a top surface of the system substrate by a die attach, the die attach having a die attach thickness, and the system further comprises a gap between the exposed end of the rigid kinetic energy diverter and the septum, which gap has a thickness equal to the die attach thickness.

18. A transducer system according to claim 15, system substrate has a top surface, and wherein the rigid kinetic energy diverter is aligned with the septum such that a straight line normal to the to surface of the system substrate would pass through both the energy diverter and the septum.

19. A transducer system according to claim 15, further comprising a cover secured to the system substrate, the cover and the system substrate defining a package volume, wherein the transducer is affixed to the system substrate within the package volume, along with an ASIC coupled to the transducer to receive an electrical output produced by the transducer in response to an acoustic signal entering the system through the acoustic aperture system.

20. A MEMS transducer comprising:
a semiconductor substrate having a top layer, and a bottom surface opposite the top layer;

a frontside cavity extending into the substrate from the bottom surface and forming an aperture at the bottom surface;

a transducer element having a movable diaphragm disposed at the top layer of the substrate and exposed to the aperture through the frontside cavity; and a rigid kinetic energy diverter configured to divert kinetic energy of a mass of air moving toward the movable diaphragm, the rigid kinetic energy diverter disposed within the frontside cavity and extending into the frontside cavity in a direction away from the movable diaphragm, wherein:

the frontside cavity has a plurality of portions separated by the rigid kinetic energy diverter, each portion of the plurality of portions exposing an underside of the transducer structure through the frontside cavity.

21. The MEMS transducer of claim 20, wherein the movable diaphragm comprises a first diaphragm and a second diaphragm, the first diaphragm and a second diaphragm each configured to produce an electrical output in response to incident acoustic energy, and wherein:

the first diaphragm and the second diaphragm are separated by a bridge;

the rigid kinetic energy diverter is suspended from the bridge; and the first diaphragm is electrically coupled to the second diaphragm to sum the individual outputs so that the first diaphragm and the second diaphragm form a single capacitor.

22. The MEMS transducer of claim 20, wherein the movable diaphragm has a geometric center, and the rigid kinetic energy diverter is disposed in line with the geometric center of the movable diaphragm.

23. The MEMS transducer of claim 20, wherein the exposed end of the rigid kinetic energy diverter is concave.

24. The MEMS transducer of claim 20, wherein the rigid kinetic energy diverter is contiguous with the top layer.

25. The MEMS transducer of claim 20, wherein the frontside cavity defines a set of sidewalls, and wherein the rigid kinetic energy diverter is suspended from the set of sidewalls.

26. The MEMS transducer of claim 20, further comprising a backplate forming a variable capacitor with the movable diaphragm, the backplate disposed between the frontside cavity and the movable diaphragm, and wherein the rigid kinetic energy diverter is suspended from the backplate.

27. The MEMS transducer of claim 20, wherein the rigid kinetic energy diverter extends through the frontside cavity so that the exposed end extends to a plane defined by the bottom surface.

* * * * *